(12) United States Patent
Truhitte et al.

(10) Patent No.: US 10,199,311 B2
(45) Date of Patent: Feb. 5, 2019

(54) LEADLESS SEMICONDUCTOR PACKAGES, LEADFRAMES THEREFOR, AND METHODS OF MAKING

(71) Applicant: SEMICONDUCTOR COMPONENTS INDUSTRIES, LLC, Phoenix, AZ (US)

(72) Inventors: Darrell D. Truhitte, Phoenix, AZ (US); Soon Wei Wang, Seremban (MY); Chee Hiong Chew, Seremban (MY)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 0 days.

(21) Appl. No.: 15/415,504

(22) Filed: Jan. 25, 2017

(65) Prior Publication Data
US 2017/0133302 A1    May 11, 2017

Related U.S. Application Data

(60) Continuation-in-part of application No. 15/357,680, filed on Nov. 21, 2016, and a continuation-in-part of
(Continued)

(51) Int. Cl.
*H01L 21/48* (2006.01)
*H01L 23/495* (2006.01)
(Continued)

(52) U.S. Cl.
CPC .... *H01L 23/49541* (2013.01); *H01L 21/4828* (2013.01); *H01L 21/561* (2013.01);
(Continued)

(58) Field of Classification Search
CPC .................................................. H01L 21/4828
See application file for complete search history.

(56) References Cited

U.S. PATENT DOCUMENTS 5,327,008 A    7/1994  Djennas et al.
5,866,939 A    2/1999  Shin et al.
(Continued)

FOREIGN PATENT DOCUMENTS

WO         2003103038 A1    12/2003
WO      WO2006105733   *    12/2012

OTHER PUBLICATIONS

Vibratory Plating Units Combining rack plating quality with barrel plating production at significant savings, Bulletin 901, Technic Inc, Equipment Division, www.technic,com , Downloaded Jan. 15, 2014.
(Continued)

*Primary Examiner* — Asok K Sarkar
*Assistant Examiner* — Grant Withers
(74) *Attorney, Agent, or Firm* — IPTechLaw

(57) ABSTRACT

A leadframe includes a frame, a die pad, a contact including a flank adjacent to the frame, a first tie bar between the frame and die pad, and a second tie bar between the die pad and contact. The leadframe is disposed over a carrier. A semiconductor die is disposed over the die pad. An encapsulant is deposited over the leadframe and semiconductor die including between the carrier and half-etched portions of the leadframe. A first trench is formed in the encapsulant to remove a portion of the frame and expose the flank of the contact. A conductive layer is formed over the flank by electroplating. A second trench is formed in the encapsulant through the second tie bar after forming the conductive layer.

13 Claims, 35 Drawing Sheets

Related U.S. Application Data application No. 15/063,011, filed on Mar. 7, 2016, now Pat. No. 9,899,349, which is a continuation-in-part of application No. 14/168,850, filed on Jan. 30, 2014, now abandoned, which is a continuation-in-part of application No. 13/692,514, filed on Dec. 3, 2012, now abandoned, which is a continuation of application No. 13/190,922, filed on Jul. 26, 2011, now Pat. No. 8,324,026, which is a division of application No. 12/362,142, filed on Jan. 29, 2009, now Pat. No. 8,071,427.

(51) Int. Cl.
*H01L 21/56* (2006.01)
*H01L 23/00* (2006.01)
*H01L 23/31* (2006.01)

(52) U.S. Cl.
CPC .. *H01L 23/49548* (2013.01); *H01L 23/49575* (2013.01); *H01L 23/49582* (2013.01); *H01L 24/48* (2013.01); *H01L 24/97* (2013.01); *H01L 21/568* (2013.01); *H01L 23/3107* (2013.01); *H01L 2224/45124* (2013.01); *H01L 2224/45139* (2013.01); *H01L 2224/45144* (2013.01); *H01L 2224/45147* (2013.01); *H01L 2224/48091* (2013.01); *H01L 2224/48106* (2013.01); *H01L 2224/48157* (2013.01); *H01L 2224/48247* (2013.01); *H01L 2224/48464* (2013.01); *H01L 2224/49171* (2013.01); *H01L 2224/97* (2013.01); *H01L 2924/00014* (2013.01); *H01L 2924/17747* (2013.01); *H01L 2924/181* (2013.01); *H01L 2924/19107* (2013.01)

(56) References Cited

U.S. PATENT DOCUMENTS

| | | | |
|---|---|---|---|
| 5,900,676 A | 5/1999 | Kweon et al. |
| 5,969,411 A | 10/1999 | Fukaya |
| 5,976,912 A | 11/1999 | Fukutomi et al. |
| 6,001,671 A | 12/1999 | Fjelstad |
| 6,130,473 A | 10/2000 | Mostafazadeh et al. |
| 6,143,981 A | 11/2000 | Glenn |
| 6,193,858 B1 | 2/2001 | Hradil et al. |
| 6,229,200 B1 | 5/2001 | McLellan et al. |
| 6,242,281 B1 | 6/2001 | Mclellan et al. |
| 6,255,740 B1 | 7/2001 | Tsuji et al. |
| 6,294,100 B1 | 9/2001 | Fan et al. |
| 6,338,984 B2 | 1/2002 | Minamio et al. |
| 6,498,099 B1 | 12/2002 | McLellan et al. |
| 6,545,347 B2 | 4/2003 | McLellan |
| 6,585,905 B1 | 7/2003 | Fan et al. |
| 6,593,643 B1 | 7/2003 | Seki et al. |
| 6,608,366 B1 | 8/2003 | Fogelson et al. |
| 6,638,790 B2 | 10/2003 | Minamio et al. |
| 6,664,136 B2 | 12/2003 | Motonami et al. |
| 6,734,044 B1 | 5/2004 | Fan et al. |
| 6,841,414 B1 | 1/2005 | Hu et al. |
| 6,872,599 B1 | 3/2005 | Li et al. |
| 6,940,154 B2 | 9/2005 | Pedron et al. |
| 7,071,545 B1 | 7/2006 | Patel et al. |
| 7,091,581 B1 | 8/2006 | McLellan et al. |
| 7,183,630 B1 | 2/2007 | Fogelson et al. |
| 7,247,526 B1 | 7/2007 | Fan et al. |
| 7,262,491 B2 | 8/2007 | Islam et al. |
| 7,443,043 B2 | 10/2008 | Sakamoto |
| 7,635,910 B2 | 12/2009 | Sinaga et al. |
| 7,786,557 B2 | 8/2010 | Hsieh |
| 7,846,774 B2 | 12/2010 | Yee et al. |
| 7,875,963 B1 | 1/2011 | Kim et al. |
| 8,071,427 B2 | 12/2011 | Celaya et al. |
| 8,089,166 B2 | 1/2012 | Kim |
| 8,318,340 B2 | 11/2012 | Stimits |
| 8,444,840 B2 | 5/2013 | Stimits et al. |
| 8,648,474 B2 | 2/2014 | Nondhasittichai et al. |
| 8,994,160 B2 | 3/2015 | Kimura |
| 2002/0067486 A1 | 6/2002 | Forney et al. |
| 2002/0144396 A1 | 10/2002 | Glenn |
| 2004/0142505 A1 | 7/2004 | Huang et al. |
| 2005/0003586 A1 | 1/2005 | Shimanuki et al. |
| 2005/0093117 A1 | 5/2005 | Masuda et al. |
| 2005/0116321 A1 | 6/2005 | Li et al. |
| 2005/0139982 A1* | 6/2005 | Fukaya ................. H01L 21/565 257/690 |
| 2005/0206010 A1 | 9/2005 | Noquil et al. |
| 2007/0126092 A1 | 6/2007 | San Antonio et al. |
| 2007/0176267 A1 | 8/2007 | Abbott |
| 2008/0001263 A1 | 1/2008 | Dimaano et al. |
| 2008/0226976 A1 | 9/2008 | Stimits |
| 2008/0258273 A1 | 10/2008 | Liang et al. |
| 2008/0290484 A1 | 11/2008 | Low et al. |
| 2009/0160037 A1 | 6/2009 | Bayan et al. |
| 2009/0289335 A1 | 11/2009 | Camacho et al. |
| 2011/0115061 A1* | 5/2011 | Krishnan ......... H01L 23/49541 257/676 |
| 2011/0244629 A1 | 10/2011 | Gong et al. |
| 2012/0043660 A1 | 2/2012 | Poddar et al. |
| 2012/0112333 A1* | 5/2012 | Liu ................... H01L 21/4828 257/676 |
| 2013/0320527 A1 | 12/2013 | Sunaga et al. |
| 2016/0056097 A1 | 2/2016 | Bai et al. |
| 2016/0254217 A1 | 9/2016 | Lu et al. |
| 2017/0263537 A1* | 9/2017 | Suzuhara ............ H01L 21/4825 |

OTHER PUBLICATIONS

"Soldering the QFN Stacked Die Sensors to a PC Board," by Thomas Koschmieder, Cheol Han, Kimberly Tuck, and John Dixon, Freescale Semiconductor Application Note AN 3111, Rev 5, Apr. 2010, 9 Pages.

* cited by examiner

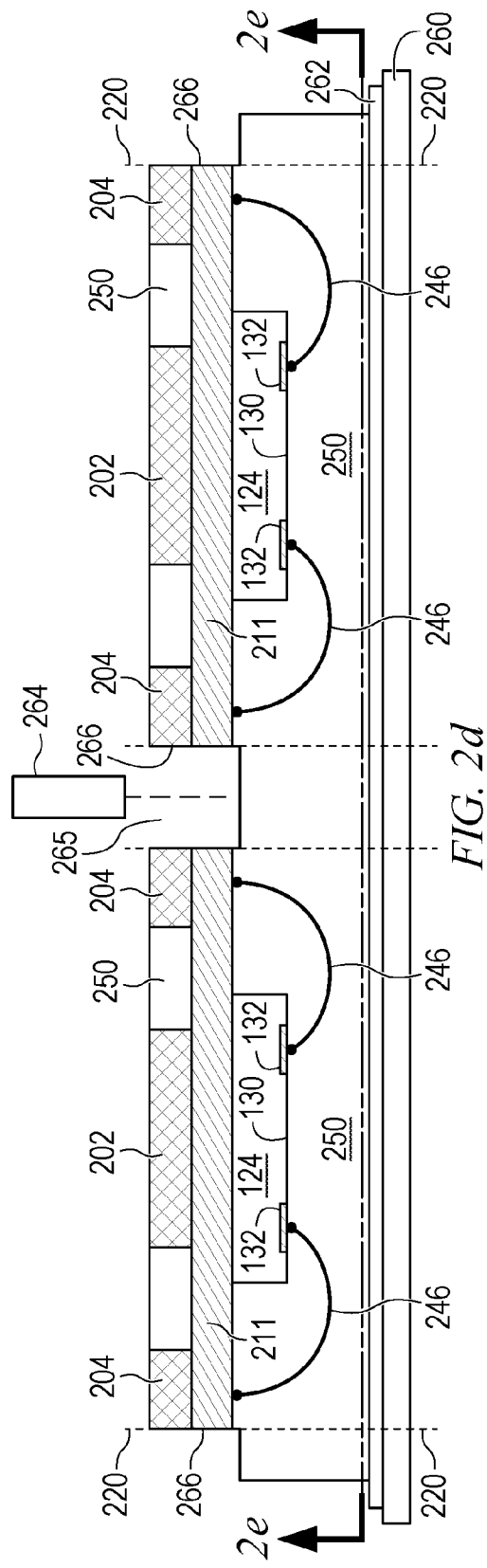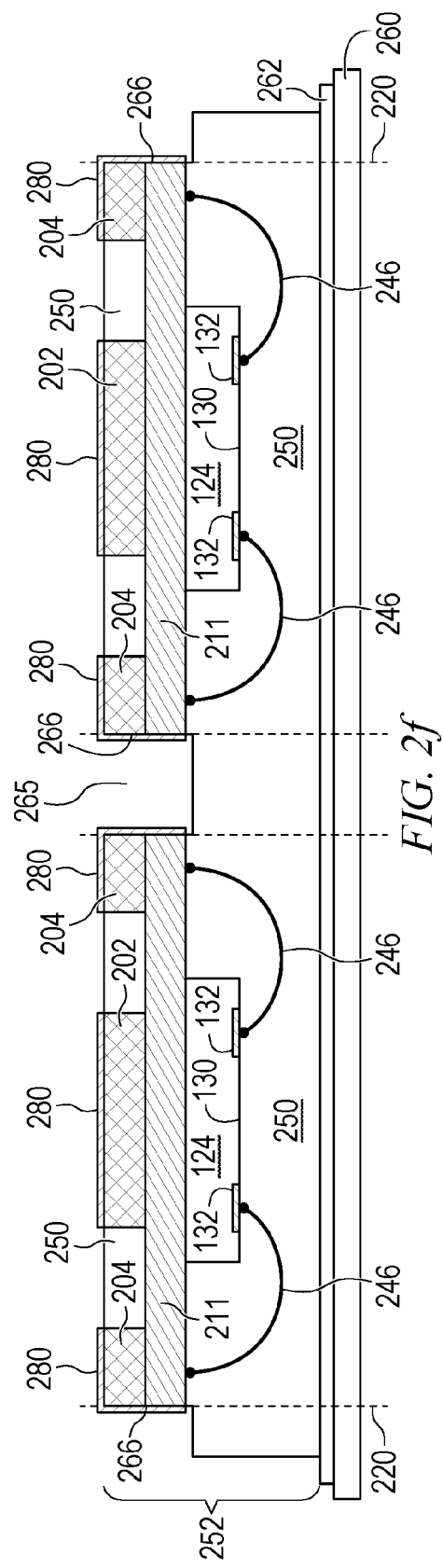

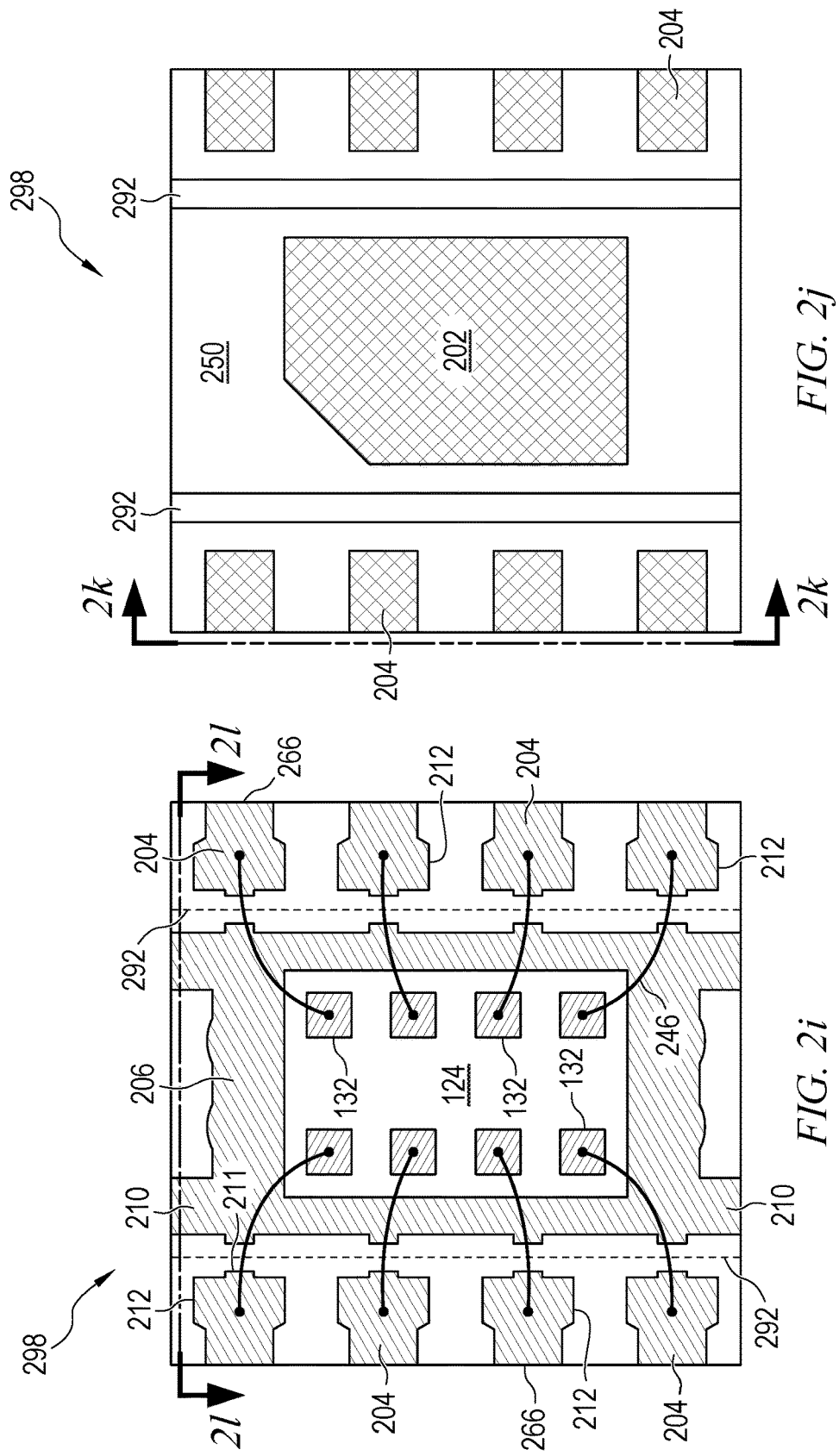

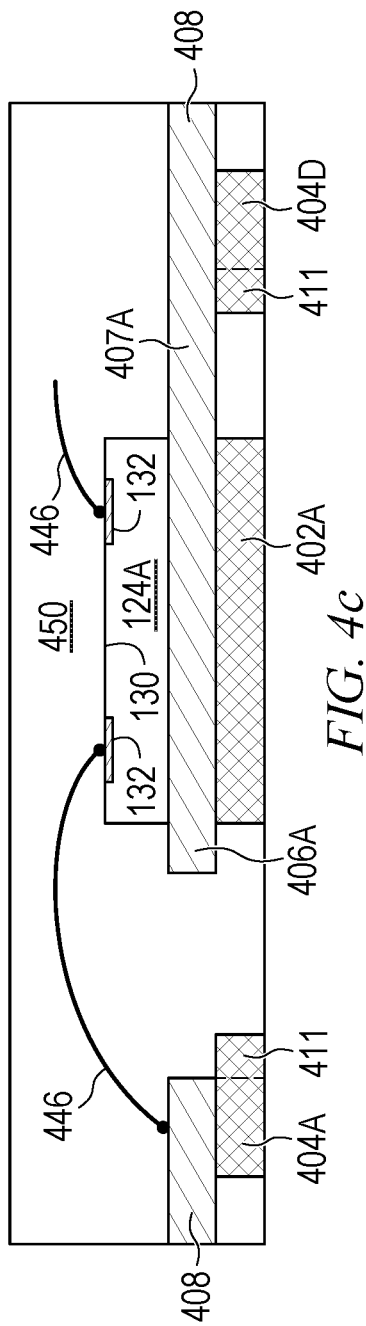
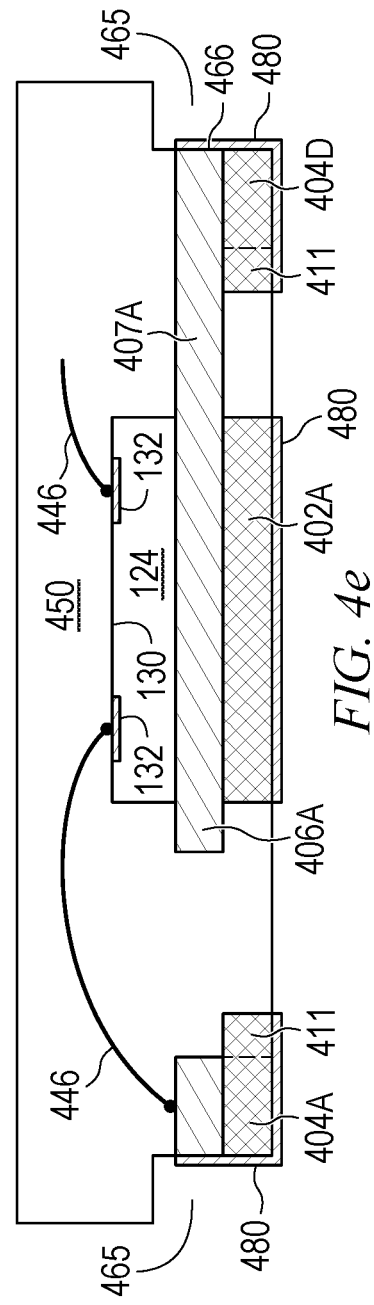

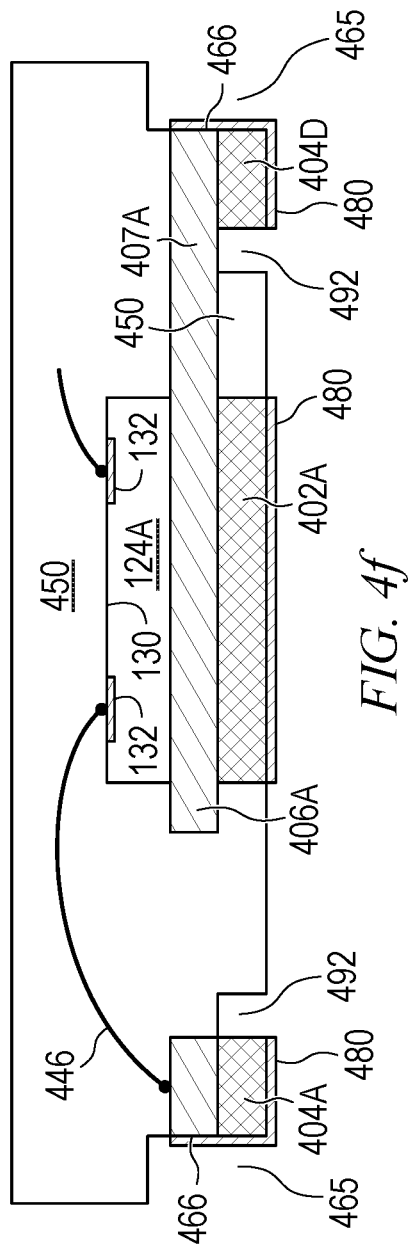
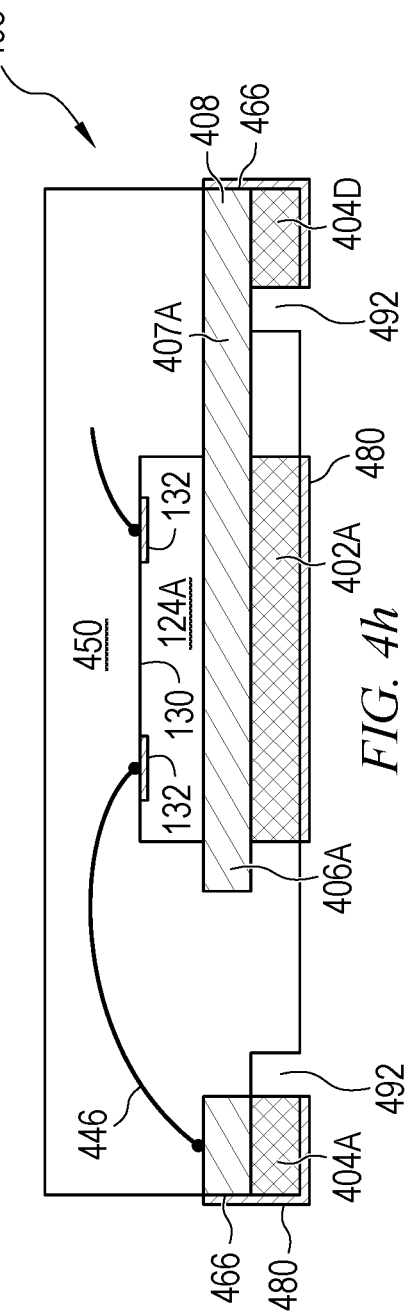

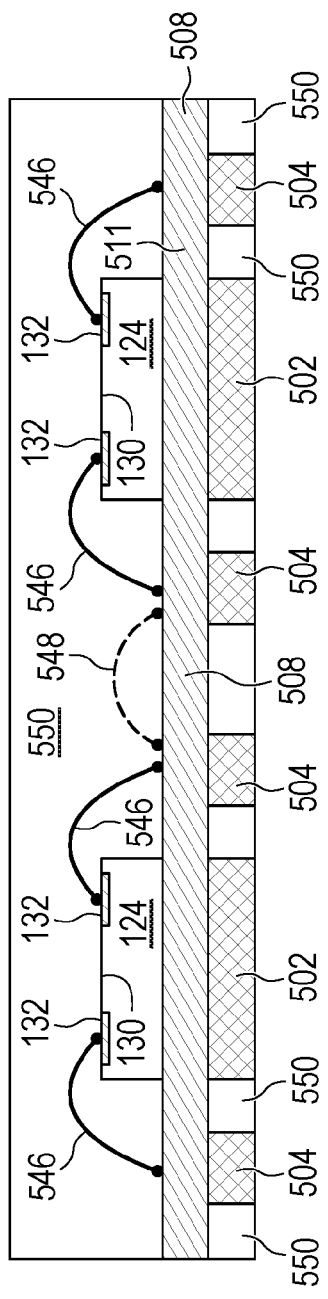
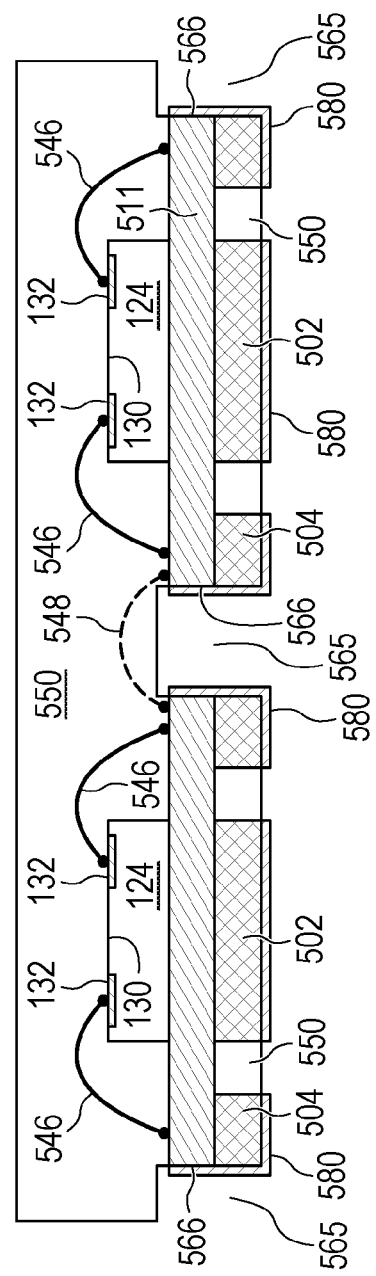

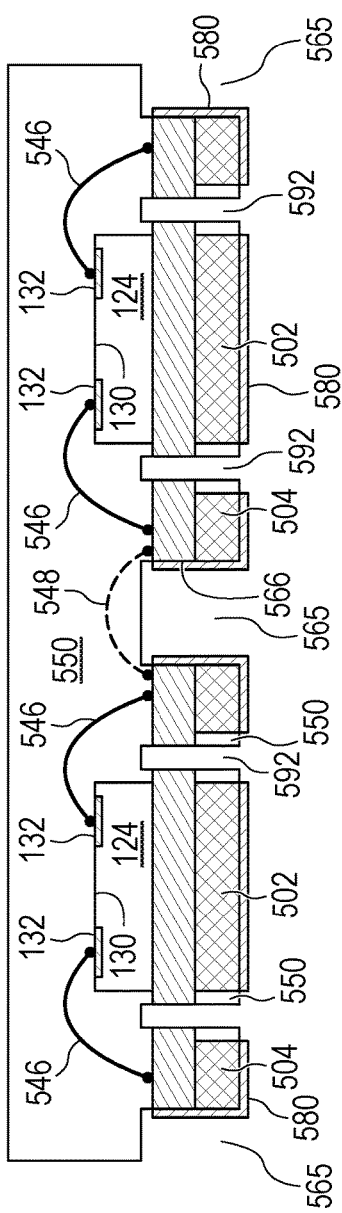
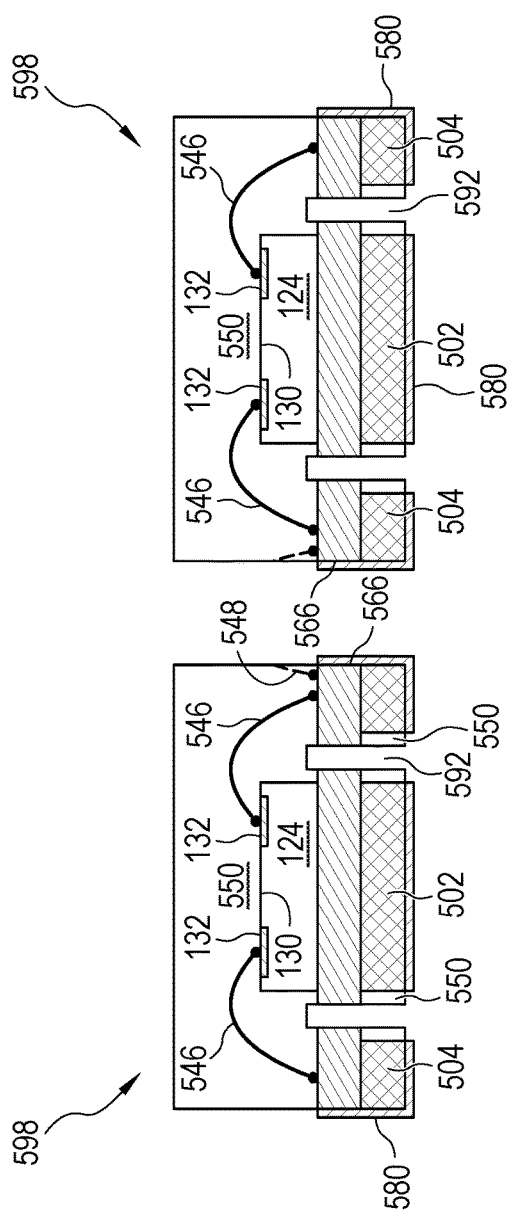
FIG. 5g
FIG. 5h

LEADLESS SEMICONDUCTOR PACKAGES, LEADFRAMES THEREFOR, AND METHODS OF MAKING

CLAIM TO DOMESTIC PRIORITY

The present application is a continuation-in-part application of U.S. patent application Ser. No. 15/357,680, filed Nov. 21, 2016, which application is incorporated herein by reference. The present application is further a continuation-in-part of U.S. patent application Ser. No. 15/063,011, filed Mar. 7, 2016, which is a continuation-in-part of U.S. patent application Ser. No. 14/168,850, filed Jan. 30, 2014, which is a continuation-in-part of U.S. patent application Ser. No. 13/692,514, now abandoned, filed Dec. 3, 2012, which is a continuation of U.S. patent application Ser. No. 13/190,922, now U.S. Pat. No. 8,324,026, filed on Jul. 26, 2011, which is a division of U.S. patent application Ser. No. 12/362,142, now U.S. Pat. No. 8,071,427, filed on Jan. 29, 2009, which applications are incorporated herein by reference.

BACKGROUND

Semiconductor devices are commonly found in modern electronic products. Semiconductor devices vary in the number and density of electrical components. Semiconductor devices perform a wide range of functions such as analog and digital signal processing, sensors, transmitting and receiving electromagnetic signals, controlling electronic devices, power management, and audio/video signal processing. Discrete semiconductor devices generally contain one type of electrical component, e.g., light emitting diode (LED), small signal transistor, resistor, capacitor, inductor, diodes, rectifiers, thyristors, and power metal-oxide-semiconductor field-effect transistor (MOSFET). Integrated semiconductor devices typically contain hundreds to millions of electrical components. Examples of integrated semiconductor devices include microcontrollers, application specific integrated circuits (ASIC), power conversion, standard logic, amplifiers, clock management, memory, image sensors, interface circuits, and other signal processing circuits.

Semiconductor devices perform a wide range of functions such as signal processing, high-speed calculations, transmitting and receiving electromagnetic signals, controlling electronic devices, transforming sunlight to electricity, and creating visual images for television displays. Semiconductor devices are found in the fields of entertainment, communications, power conversion, networks, computers, and consumer products. Semiconductor devices are also found in military applications, aviation, automotive, industrial controllers, and office equipment.

FIG. 1 illustrates a conventional leadless package 110 as a quad flat no-lead (QFN) or dual flat no-lead (DFN) package. Leadless package 110 includes a semiconductor die 124 disposed on a leadframe 126. Leadframe 126 is formed from a metallic substrate with material of the substrate removed to create a plurality of leads 126a surrounding a die pad 126b. Semiconductor die 124 is disposed on die pad 126b and includes contact pads coupled to leads 126a by bond wires 136. An encapsulant or molding compound 140 is disposed around semiconductor die 124 and leadframe 126 for electrical isolation, physical support, and protection from contaminants.

Leadless package 110 is mounted to a printed circuit board (PCB) or other substrate 120. Solder 150 is reflowed between leadframe contacts 126a and contact pads 122 on PCB 120 to form a metallurgical and electrical connection between leadless package 110 and the PCB. Leadless package 110 includes leads 126a for external interconnection, which are simply portions of a metal leadframe exposed from the final package. Leads 126a are used instead of leads that extend from the package laterally and/or vertically as in traditional semiconductor package types. The exposed wettable material of contacts 126a on the lateral surfaces of package 110, referred to as a wettable flank, allows solder 150 to form filleted surfaces 152 after leadless package 110 is mounted onto PCB 120.

Fillets 152 are useful to manufacturers of electronic devices because proper interconnection between package 110 and PCB 120 can be verified visually by a human or by an automatic visual inspection device 156 including an image sensor and a computer programmed to analyze the images. If a visual inspection shows that a proper fillet 152 was not formed for one of the connections of a lead 126a to a contact pad 122, an error in the specific PCB 120 is recorded. The device with the faulty connection can be repaired or discarded. If visual inspection device 156 verifies that each connection between leadless package 110 and PCB 120 includes a proper fillet 152, the manufacturer can have confidence that the package is properly connected to the system as a whole.

Leadless package 110 reduces the footprint required on PCB 120 over many prior art packages by not having leads that extend from the package, and instead having leads 126a that remain within the footprint, and within the height, of the package body. However, forming fillets 152 for visual inspection relies on side surfaces of leads 126a being wettable by solder 150. That is, solder 150 should flow up the sides of leads 126a to form a fillet 152 between side surfaces of contacts 126a and contact pad 122.

To promote reflow of solder 150 onto side surfaces of contacts 126a, a manufacture of package 110 will commonly plate leads 126a with a wettable material as part of the manufacturing process of the package. Metal plating is commonly done with various electroplating or electroless deposition methods. Electroplating is the more desirable plating method because a thicker and faster metal deposition occurs. The thicker metal layer provided by electroplating provides a more reliable solder fillet, especially after parts sit on a shelf for a significant period of time before being soldered. On the other hand, electroplating for the full thickness of contacts 126a can be a challenge because a portion of the side surfaces may remain during electroplating to provide electrical current for the electroplating process.

Therefore, a need exists for leadframe designs that are capable of providing electrical interconnection to leads for electoplating the full thickness of the leads, while also allowing subsequent electrical isolation of the leads for use of the final package in a larger system.

BRIEF DESCRIPTION OF THE DRAWINGS

FIGS. 2a-2m illustrate forming a leadless package having a leadframe and plated leads;

FIGS. 4a-4j illustrate forming a leadless package with multiple die and shared tie bars;

FIGS. 5a-5j illustrate forming a quad flat non-leaded (QFN) package with individual tie bars for the leads using bond wires between devices;

DETAILED DESCRIPTION OF THE DRAWINGS

The following describes one or more embodiments with reference to the figures, in which like numerals represent the same or similar elements. Among the embodiments, similar elements with similar characteristics and capabilities are labelled with reference numbers ending in the same two numerals but beginning in a numeral representing the figure number. While the figures are described in terms of the best mode for achieving certain objectives, the description is intended to cover alternatives, modifications, and equivalents as may be included within the spirit and scope of the disclosure, including combinations of the disclosed embodiments. Implementations of the disclosed embodiments may comprise any shape, size, style, type, model, version, measurement, concentration, material, quantity, method step, etc., that is known in the art and consistent with the intended operation of the disclosed embodiments and methods of making.

Figure 1:
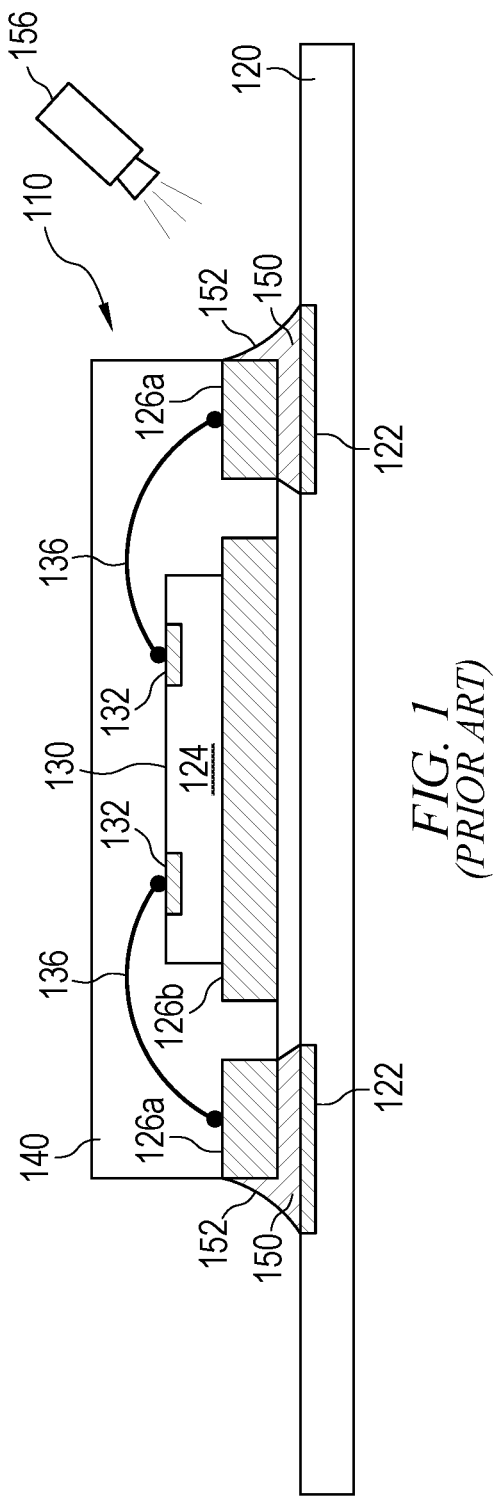
FIG. 1 illustrates a leadless semiconductor package connected to a substrate by visually verifiable solder fillets.
Figure 2A:
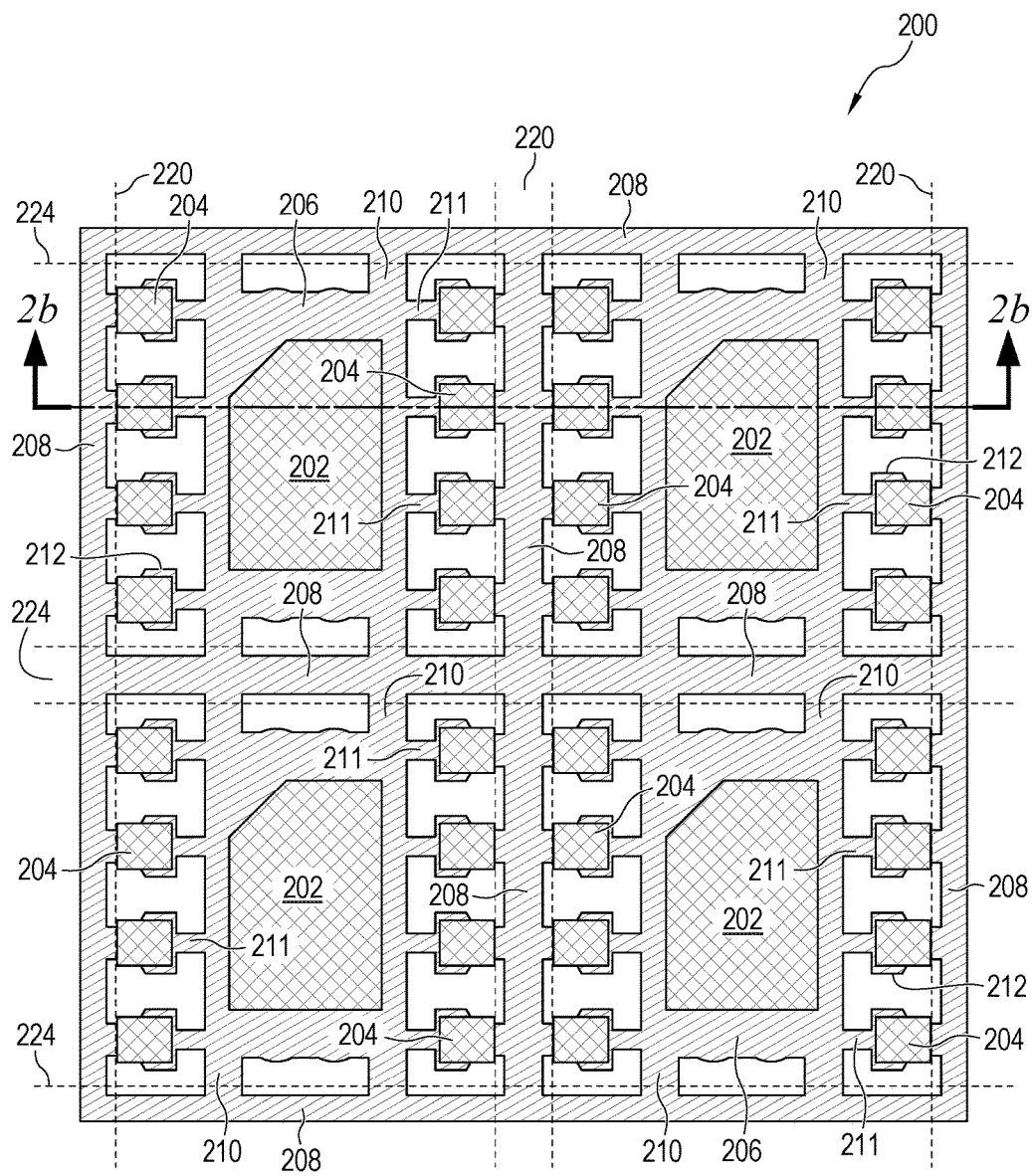
Figure 2B:
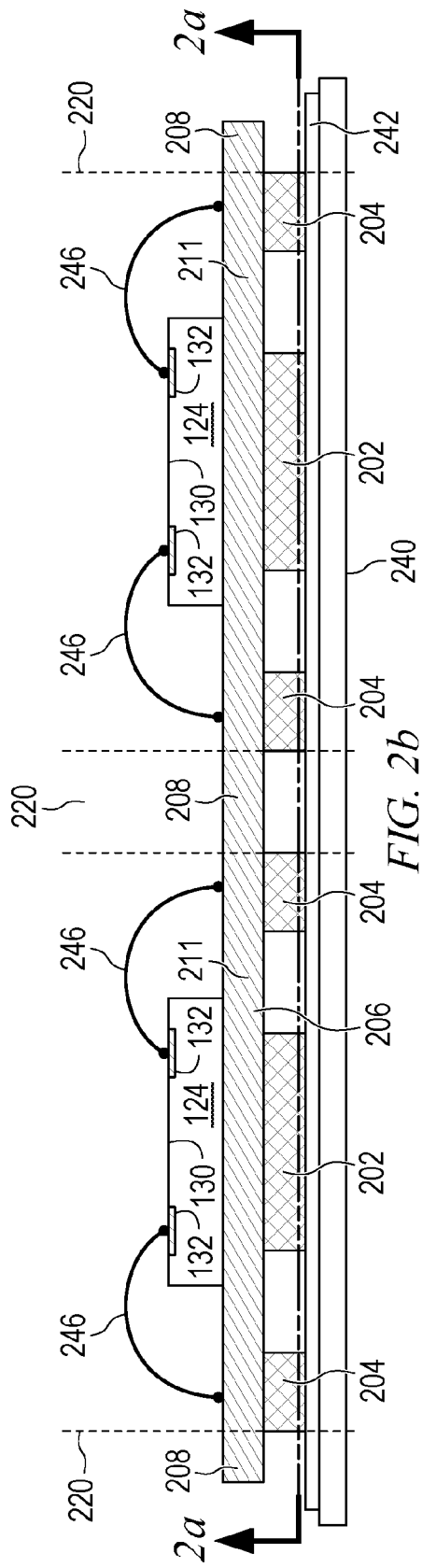

FIG. 2a illustrates a leadframe 200 in plan view, with FIG. 2b illustrating a cross-sectional view of the leadframe through line 2b-2b in FIG. 2a. FIG. 2a illustrates the bottom surface of leadframe 200, which is defined herein as the major surface of a leadframe that is exposed from the final package for electrical connection. The top surface of leadframe 200 is the side that semiconductor die 124 is disposed on in FIG. 2b. The top surface of leadframe 200 is hidden from view in FIG. 2a. Side surfaces or flanks of leadframe 200 are surfaces that extend between the top and bottom surfaces.

Manufacturing of leadframe 200 commonly begins with a solid sheet or plate of conductive material, commonly copper (Cu). Copper alloys, steel, or other conductive materials are used to form leadframe 200 in other embodiments. Masking layers are patterned over the top and bottom surfaces of leadframe 200, and the leadframe is half-etched from each side. The figures follow a convention that the top half of leadframes are shaded with line hatching, while the bottom half of leadframes are shaded with square hatching. Even though the halves are shaded differently, leadframe 200 is normally a single uniform and continuous conductive material. Half-etching the original sheet of conductive material from the bottom exposes the line-hatched half of leadframe 200 through openings etched through the square-hatched half. Half-etching from the top exposes the line-hatched half of leadframe 200 through the square-hatched half. Areas where leadframe 200 is half-etched from both the top and the bottom are not shaded because the combination of half-etching from both the top and the bottom fully removes leadframe 200 in those areas. Half-etching refers to etching into a sheet of metal or other conductive material for approximately half the thickness of the sheet.

FIG. 2a is a view of leadframe 200 from the bottom. The areas where square hatching are visible, i.e., die paddles 202 and contacts 204, are areas where no half-etching from the bottom occurs. The square-hatched bottom half of leadframe 200 remains in those areas. The line-hatched areas visible in FIG. 2a are regions that were half-etched from the bottom to remove the square-hatched material, but no half-etching occurs from the top so the line-hatched material remains. Areas with no hatching in FIG. 2a are half-etched from both the top and the bottom to create openings or empty space in leadframe 200.

Die paddles 202 and contacts 204 are not etched, and remain at the full thickness of the original conductive sheet. Die paddles 202 and contacts 204 extend downward relative to the rest of leadframe 200. In FIG. 2a, die paddles 202 and contacts 204 are closer to the viewer than the rest of leadframe 200. Die paddles 202 and contacts 204 remain thicker to be exposed from the subsequently applied encapsulant for mounting of the final device and electrical interconnection to a larger system.

Leadframe 200 includes four die paddles 202. Each die paddle 202 is surrounded by eight contacts 204, four contacts on two opposite sides of the die paddles. Each set of one die paddle 202 and eight contacts 204 constitutes a unit of leadframe 200. Leadframe 200 allows for the formation of four devices at once. In other embodiments, leadframe 200 is much larger and allows many more than four devices to be formed at once by tessellating the units for any desired length and width. Similarly, while each die paddle 202 includes eight associated contacts 204, any number of contacts are formed per unit in other embodiments as desired.

The portions of leadframe 200 that are half-etched from the bottom but not the top, which are the portions in FIG. 2a with line hatching, include die pad 206, frame 208, die pad tie bars 210, contact tie bars 211, and contact wings 212. Die pad 206 is a half-etched portion of leadframe 200 that surrounds die paddle 202. Die paddle 202 is exposed from the final device, while die pad 206 includes a larger footprint that is embedded in the encapsulant. The larger footprint of die pad 206 increases mold lock of the die pad. FIG. 2b illustrates semiconductor die 124 disposed on die pad 206 opposite die paddle 202.

Frame 208 surrounds each unit of leadframe 200 to structurally support die pad 206 and contacts 204. Frame 208 is optionally half-etched. In other embodiments, frame 208 remains at the full thickness of leadframe 200 such that the leadframe includes full thickness portions connecting each contact 204 of each unit. Die pad tie bars 210 attach and electrically connect each die pad 206 and die paddle 202 to frame 208 at the sides of die pad 206 where contacts 204 do not exist. Contact tie bars 211 attach each contact 204 to an associated die pad 206. Each contact 204 is also connected directly to frame 208 opposite tie bars 211. Contact wings 212 are a half-etched portion of leadframe 200 that extends out from the full-thickness portions of leads 204 to increase mold lock.

Leadframe 200 includes saw streets 220 and saw streets 224. Saw streets 220 are oriented perpendicularly to saw streets 224. Saw streets 220 and 224 extend over frame 208 between each of the individual units of leadframe 200. When sawn through, saw streets 220 separate contacts 204 of one unit from contacts 204 of an adjacent unit to expose the side surfaces or flanks of each contact. Saw streets 224 separate die pads 206 of adjacent packages when sawn through by severing die pad tie bars 210. In the case of both saw streets 220 and saw streets 224, frame 208 within the saw streets are fully removed when the saw streets are sawn through to separate adjacent packages.

In FIG. 2b, leadframe 200 is disposed on a carrier or temporary substrate 240 containing sacrificial base material such as silicon, polymer, beryllium oxide, glass, or other suitable low-cost, rigid material for structural support. An optional interface layer or double-sided tape 242 is formed over carrier 240 as a temporary adhesive bonding film, etch-stop layer, or thermal release layer. Leadframe 200 is disposed on carrier 240 with die paddles 202 and contacts 204 contacting the carrier or interface layer 242. The half-etched nature of frame 208, tie bars 211, and die pads 206 is illustrated by a separation that remains between frame 200 and carrier 240 in the half-etched regions.

Semiconductor die 124 are disposed on die pads 206 with active surface 130 oriented away from leadframe 200. Active surface 130 includes one or more active and passive components formed by semiconductor doping, metal deposition, and other front-end semiconductor manufacturing processes. Contact pads 132 are formed on active surface 130 for electrical interconnection. Die paddles 202 are exposed in the final product and provided electrical connection to the back surface of semiconductor die 124 for use in embodiments where a voltage applied to the back surface of semiconductor die 124 has a desired effect on the active functionality of the semiconductor die. In some embodiments, semiconductor die 124 has multiple active surfaces.

A plurality of bond wires 246 is formed between contacts 204 on leadframe 200 and contact pads 132 of semiconductor die 124. Bond wires 246 are mechanically and electrically coupled to contacts 204 and contact pads 132 by thermocompression bonding, ultrasonic bonding, wedge bonding, stitch bonding, ball bonding, or other suitable bonding technique. Bond wires 246 include a conductive material such as Copper, Aluminum, Gold, Silver, a combination thereof, or another suitable conductive material. Bond wires 246 represent one type of interconnect structure that electrically connects contacts 204 to contact pads 132. In another embodiment, conductive bumps are formed on contact pads 132, and semiconductor die 124 is flip-chip bonded onto contacts 204 without needing die paddle 202 and die pad 206.

Figure 2C:
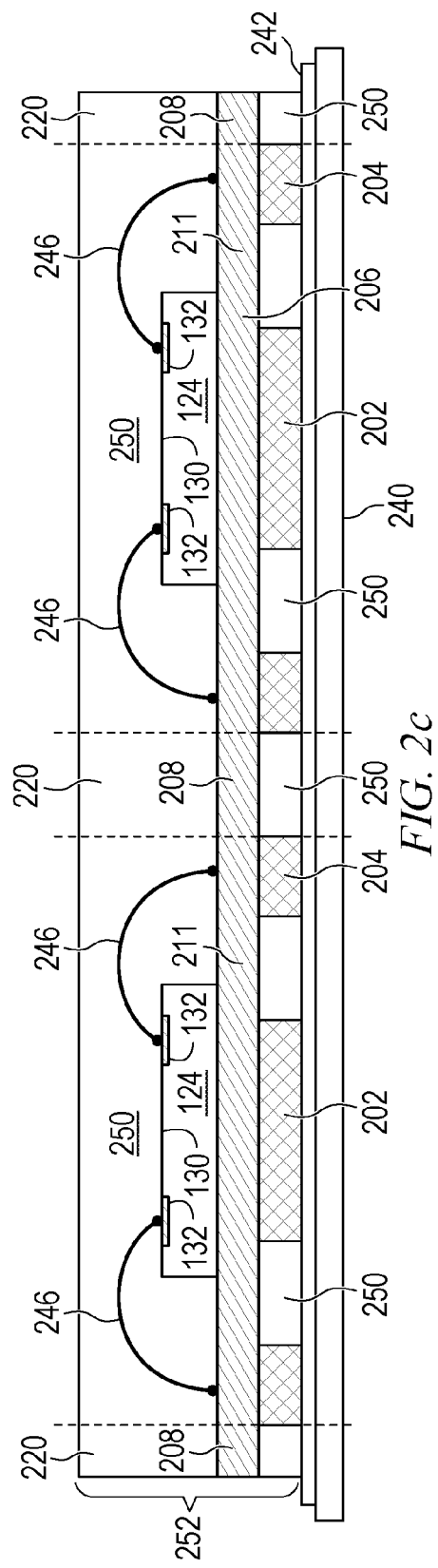

In FIG. 2c, an encapsulant or molding compound 250 is deposited over semiconductor die 124, bond wires 246, and leadframe 200 using a paste printing, compressive molding, transfer molding, liquid encapsulant molding, vacuum lamination, spin coating, or other suitable applicator. Encapsulant 250 covers the side surfaces and active surface 130 of semiconductor die 124. Encapsulant 250 can be polymer composite material, such as epoxy resin with filler, epoxy acrylate with filler, or polymer with proper filler. Encapsulant 250 is non-conductive and environmentally protects the semiconductor device from external elements and contaminants. Encapsulant 250 also protects semiconductor die 124 from degradation due to exposure to light. Encapsulant 250, semiconductor die 124, leadframe 200, and bond wires 246 combine to form a reconstituted wafer or panel 252. Panel 252 may include any desired number of semiconductor die 124 in a two-dimensional grid by using a leadframe 200 of an appropriate size.

Encapsulant 250 flows between carrier 240 and the half-etched portions of leadframe 200, i.e., die pad 206, a frame 208, die pad tie bars 210, contact tie bars 211, and contact wings 212. Encapsulant 250 extending below die pad 206 and contact wings 212 helps lock die paddle 202 and contacts 204 into the encapsulant.

In FIG. 2d, panel 252 is flipped and disposed on carrier 260 with optional interface layer 262. Carrier 240 is removed by chemical etching, mechanical peeling, chemical mechanical planarization (CMP), mechanical grinding, thermal bake, UV light, laser scanning, or wet stripping. Panel 252 is disposed on carrier 260 with encapsulant 250 on the carrier and leadframe 200 oriented away from the carrier. Die paddles 202 and contacts 204 are exposed from the encapsulant opposite carrier 260. In some embodiments, carrier 240 is reused as carrier 260.

A saw blade or laser cutting tool 264 is used to singulate leadframe 200 through saw streets 220. Saw 264 forms a trench 265 that extends across substantially the entirety of frame 200 and completely removes frame 208 between adjacent contacts 204 to fully expose a flank 266 of each contact. Frame 208 being half-thickness reduces wear on saw 264 and increases the speed at which trench 265 can be formed. In some embodiments, the full thickness portions of leads 204 extends into saw streets 220 to ensure that the exposed flank 266 is full thickness. In other embodiments, the full thickness portions of leads 204 extend completely across saw streets 220 to ensure that a full-thickness of leadframe 200 is exposed with use of any thickness of saw 264. A laser cutting tool may be used to separate adjacent contacts 204 and expose flanks 266 without fully removing frame 208 within saw streets 220.

As illustrated, trench 265 is formed only partially through encapsulant 250. Encapsulant 250 remains between adjacent units to mechanically couple adjacent columns 270 of leadframe 200 to each other. In other embodiments, trench 265 extends completely through encapsulant 250 to physically separate adjacent units. Columns 270 of leadframe 200 remain aligned by each remaining on carrier 260. In some embodiments, trench 265 extends into or through carrier 260.

Figure 2E:
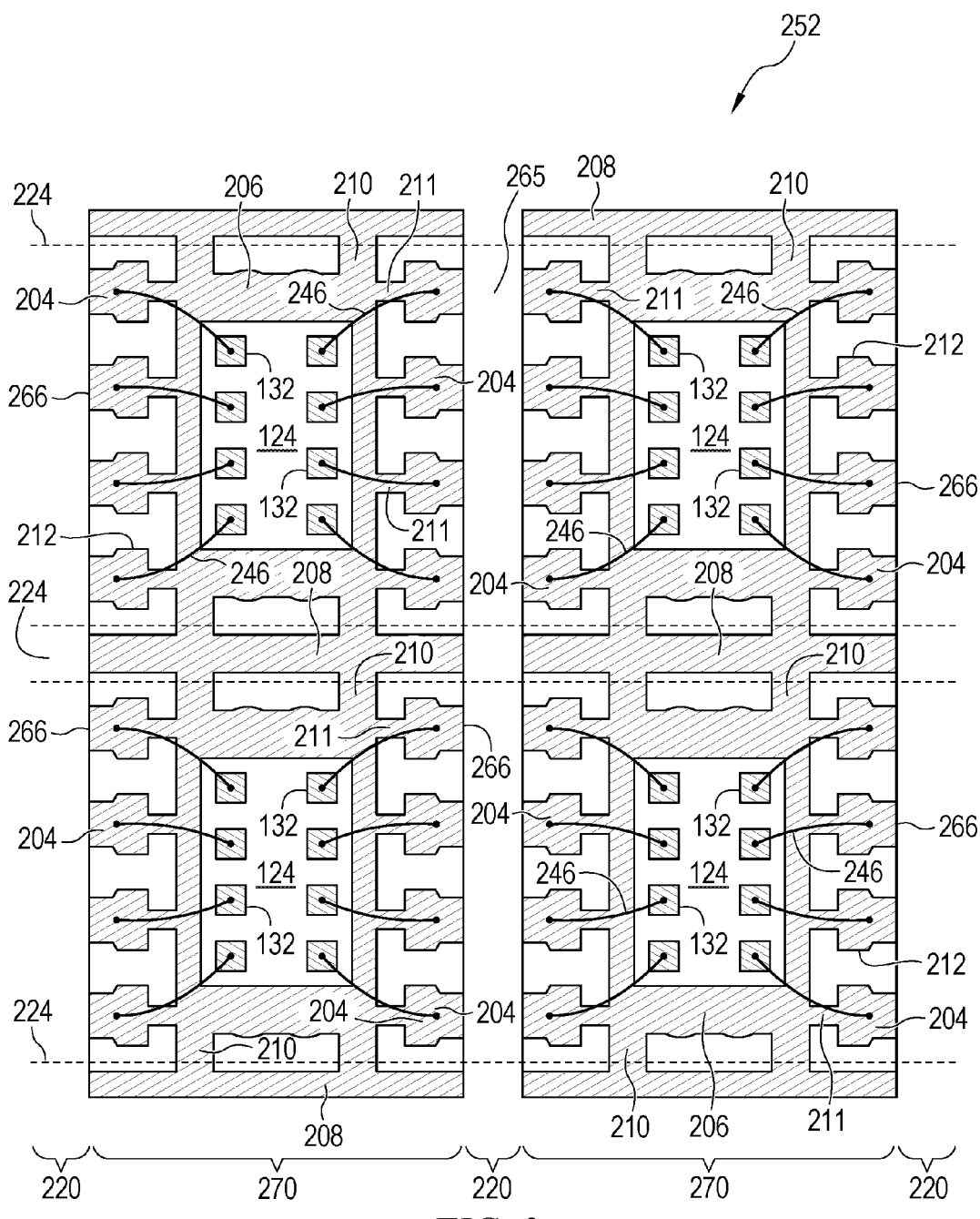

The exposed flank 266 of each contact 204 is a vertically oriented surface that extends for the full thickness of leadframe 200. At the same time, FIG. 2e shows that each aligned unit within a column 270 remains electrically coupled to each other through die pad tie bars 210 and the remaining portions of frame 208 in saw streets 224. Columns 270 remain physically coupled to each other by encapsulant 250 remaining under trench 265.

In FIG. 2f, a conductive layer 280 is plated onto die paddles 202 and leads 204 by electroplating. A voltage potential is applied to frame 208 of leadframe 200 from the top and/or bottom ends of each column 270. The voltage potential travels from frame 208 to each exposed die paddle 202 through die pads 206 and die pad tie bars 210. The electrical potential further flows to each contact 204, including the exposed flank 266 of each contact, through contact tie bars 211. Panel 252 is disposed in a plating bath with electrical current flowing through leadframe 200, and molecules of the desired metal to plate attach to exposed portions of leadframe 200, i.e., die paddles 202 and leads 204 including flanks 266. The plated conductive layer 280 extends over a full height of leadframe 200 due to trench 265 exposing flanks 266 for the full thickness of the leadframe.

Figure 2G:
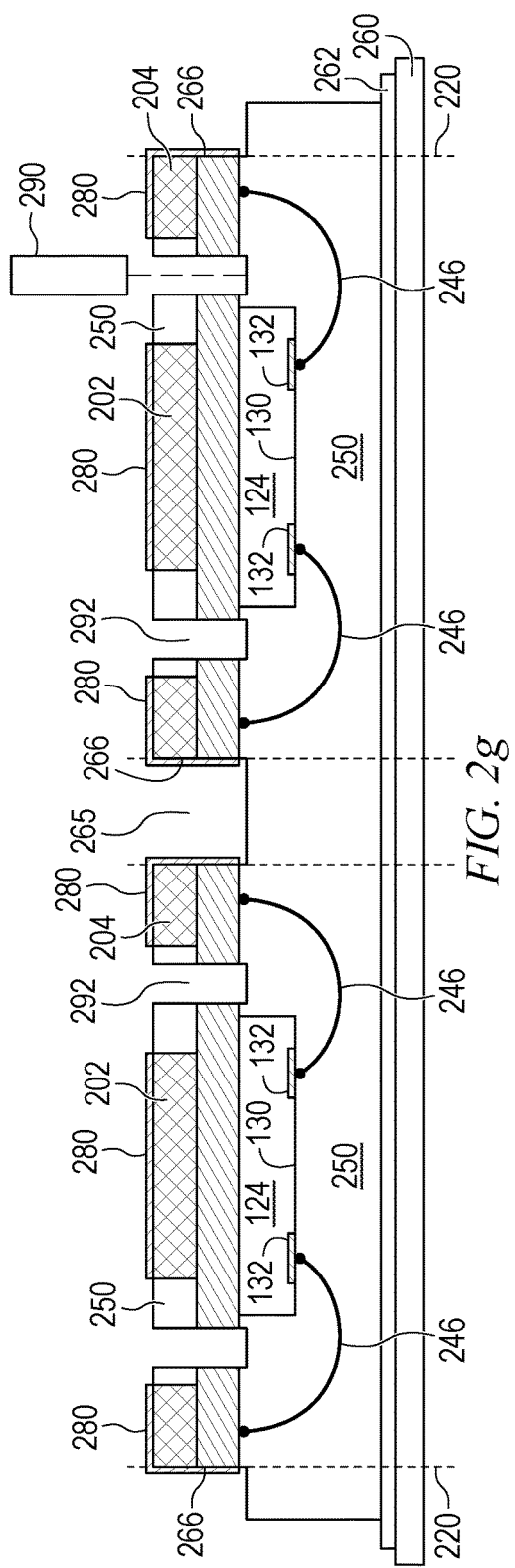

In FIG. 2g, saw blade or laser cutting tool 290 is used to form trenches 292 through contact tie bars 211. Trenches 292 run the length of each column 270 of leadframe 200 in some embodiments. In other embodiments, a laser cutting tool is used to selectively cut tie bars 211 without forming a trench extending fully across panel 252. Some tie bars 211 may remain electrically coupled to die pad 206 if a connection to the back surface of semiconductor die 124 is desired for some contacts 204. Trenches 292 electrically isolate contacts 204 from die pads 206 so that the contacts can be used to access the functionality of semiconductor die 124, and not be electrically short circuited to each terminal of the semiconductor die through die pad 206 and the other contacts.

Figure 2H:
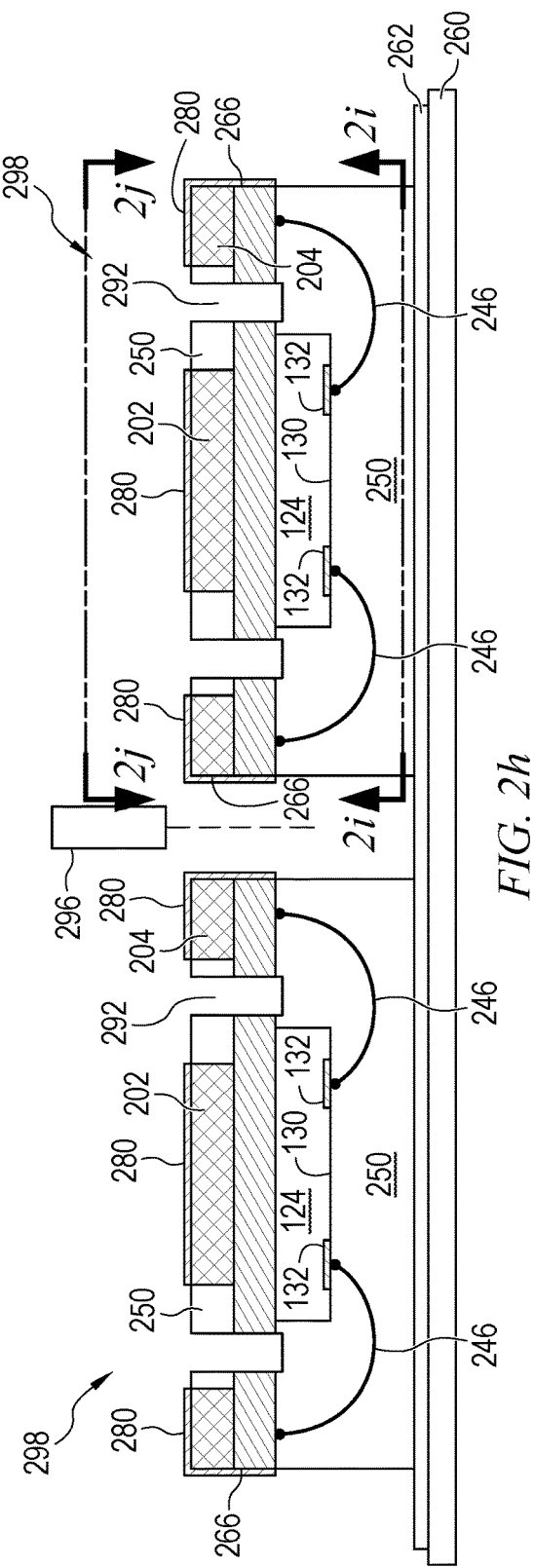

In FIG. 2h, saw blade or laser cutting tool 296 is used to singulate panel 252 into individual packages 298 by cutting through saw streets 220 and 224. Saw 296 cuts completely through encapsulant 250 to physically separate each unit of leadframe 200 into a leadless package 298. Remaining portions of frame 208 in saw streets 224 are removed. Plated conductive layer 280 is illustrated with an exaggerated thickness, and would not generally extend noticeably outside of the footprint of the final package 298. Flanks or side surfaces 266 of contacts 204 would be substantially coplanar in one embodiment. In embodiments where trench 265 was formed completely through encapsulant 250, an additional sawing step is not required through saw streets 220; only saw streets 224 are cut through by saw 296 in FIG. 2h.

FIGS. 2i-2l illustrate package 298 from various angles. FIG. 2i illustrates package 298 from a top view without encapsulant 250 illustrated to reveal semiconductor die 124 and leadframe 200. Contacts 204 are separated from die pad 206 at tie bars 211 by trenches 292. Exposed flanks 266 are plated with conductive layer 280 for the full thickness of leadframe 200 to promote wetting of solder onto side surfaces of contacts 204. FIG. 2j illustrates a bottom view of package 298 with die paddle 202 and contacts 204 exposed from encapsulant 250. Trenches 292 extend into encapsulant 250 through tie bars 211. Tie bars 211 are exposed within trenches 292 and would be visible in an angled view. In other embodiments, trenches 292 completely remove tie bars 211, and contacts 204 are directly exposed within the trench. The term contact as used herein encompasses a contact 204 by itself, and also may refer to a contact 204 in combination with any portion of tie bar 211 remaining attached to the contact after formation of trenches 292. Therefore, while tie bars 211 are exposed within trenches 292 as illustrated, one having ordinary skill in the art would consider semiconductor device 298 to have contacts exposed within trenches 292 by virtue of the tie bars being exposed.

Figure 2K:
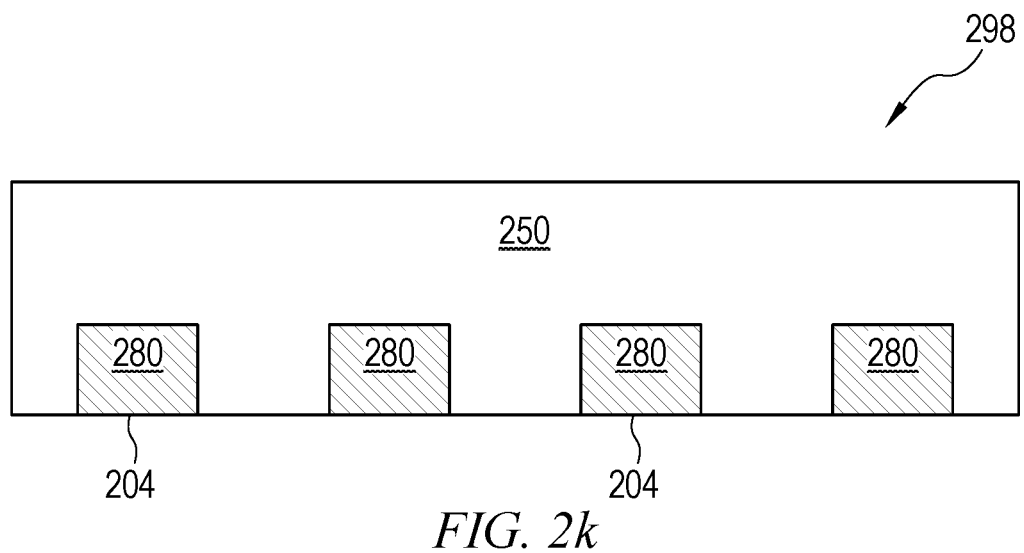
Figure 2L:
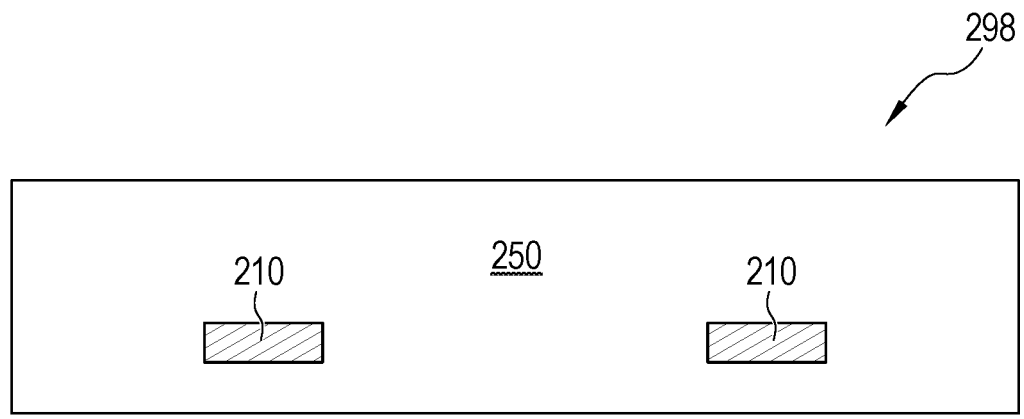

FIG. 2k illustrates a side view of package 298 with plated flanks 266 of contacts 204 exposed. FIG. 2l illustrates a side view of package 298 from a view perpendicular to FIG. 2k to show that die pad tie bars 210 are exposed from the encapsulant after cutting through saw streets 224.

Package 298 is a leadless semiconductor package with contacts 204 that are electroplated on the flanks of the contacts over the full thickness of leadframe 200. Plating contacts 204 for the full height of leadframe 200 provides a relatively large solder fillet when package 298 is mounted onto a PCB or other substrate. The larger solder fillet is more reliably detected by automatic verification machines.

Figure 2M:
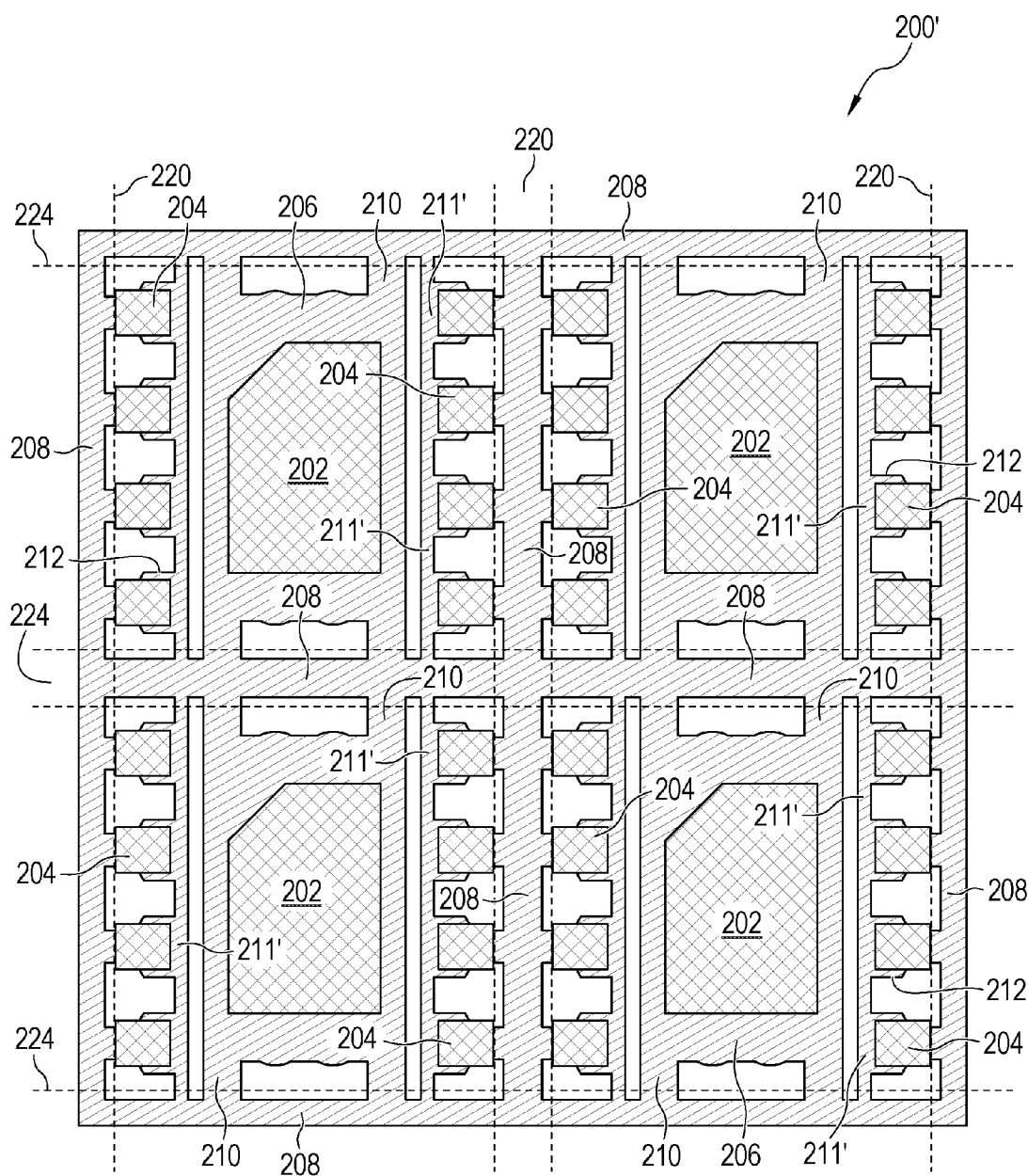

FIG. 2m illustrates an alternative leadframe design 200'. Leadframe 200' is similar to leadframe 200, but includes contact tie bars 211' to replace tie bars 211. Tie bars 211' extend completely between two horizontal frame 208 sections. Tie bars 211' electrically couple each lead 204 on a side to each other, and to frame 208, for plating without coupling to die pad 206 other than indirectly through frame 208. The manufacturing process of a semiconductor package with leadframe 200' proceeds similarly to with leadframe 200 in FIGS. 2a-2l. When trenches 292 are formed in FIG. 2g, tie bars 211' are fully removed to electrically isolate contacts 204 from each other. Contacts 204 are exposed within trenches 292 where the contacts meet tie bar 211', as with tie bars 211 in FIG. 2g. However, die pad 206 is not exposed within trenches 292 because tie bar 211' does not extend to the die pad. Leadframe 200' with tie bars 211' allows a package to be made without having die pad 206 and contacts 204 exposed in trench 292 directly across from each other, reducing the likelihood of a short circuit by errant conductive material within the trench.

Figure 3A:
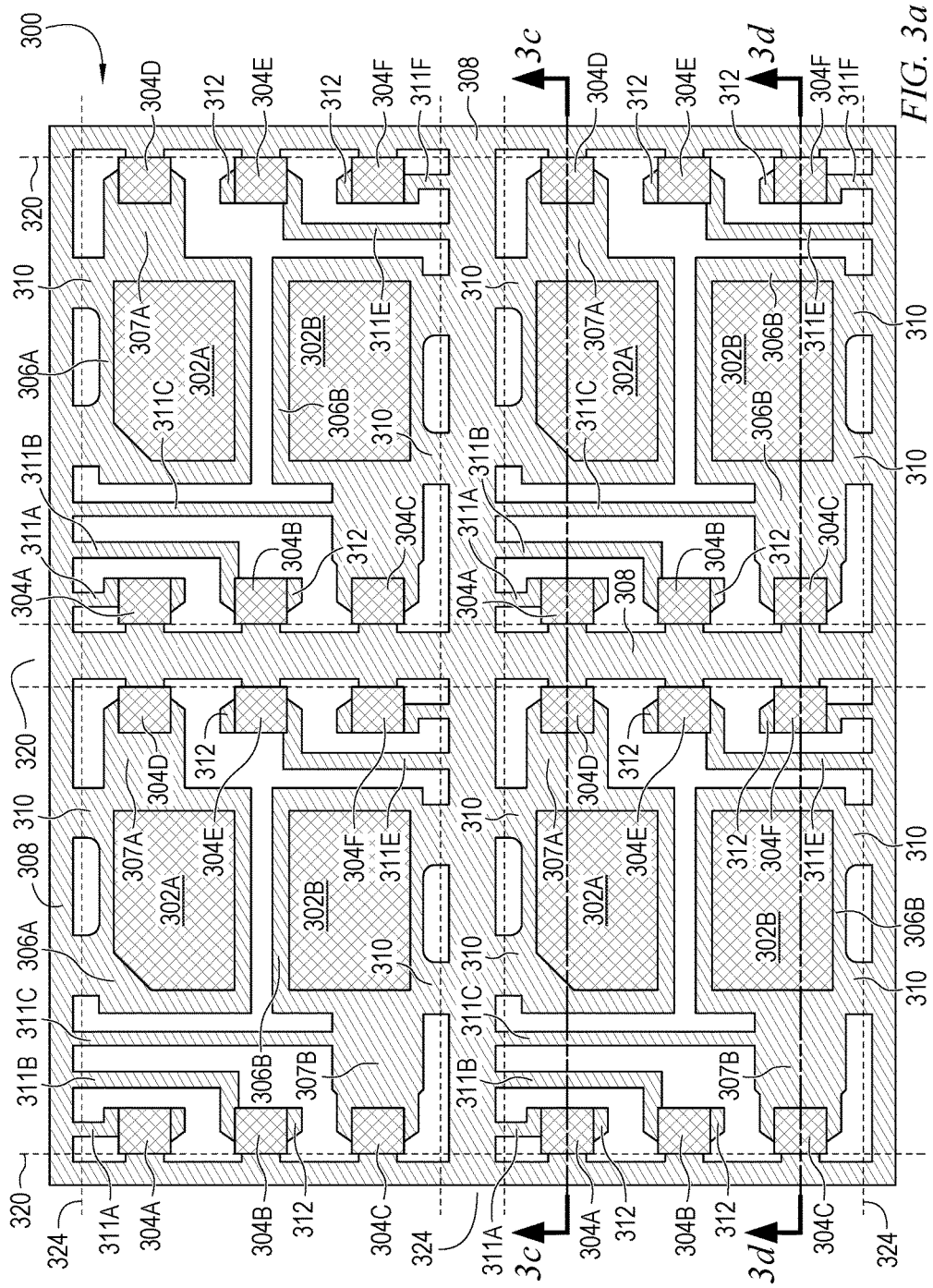
FIGS. 3a-3i illustrate forming a leadless package with multiple die and individual tie bars for the leads.
Figure 3B:
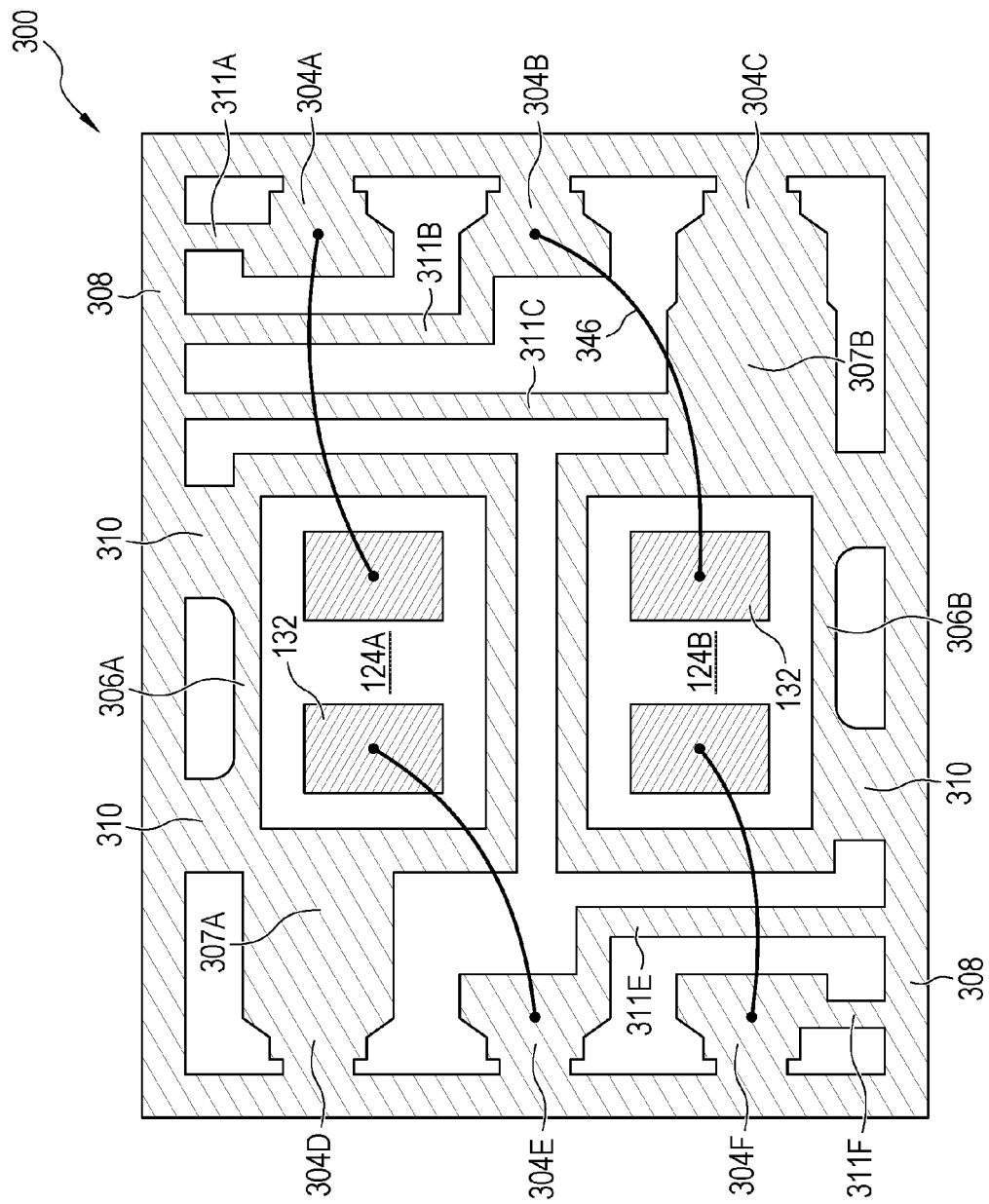

FIGS. 3a-3i illustrate forming a leadless package in an embodiment with two electrically isolated semiconductor die within the package. FIGS. 3a and 3b illustrate plan views of a leadframe 300. FIG. 3a illustrates the bottom of leadframe 300, i.e., the side that will ultimately be exposed from encapsulant for electrical interconnection to die paddles 302 and contacts 304. Die paddles 302 and contacts 304 are closer to the viewer than the rest of leadframe 300, which is half-etched from the bottom. Die paddles 302 and contacts 304 are shaded with squares to indicate that the viewer is seeing the bottom half of leadframe 300. The remainder of leadframe 300 is shaded with lines to indicate that the bottom half of the leadframe was etched away, and the viewer is seeing the top half of the leadframe. Areas with no shading are half-etched from both the top and the bottom, so a viewer sees completely through leadframe 200. Die paddles 302 and contacts 304 are thicker to be exposed from the bottom surface of the leadless package. Two die paddles 302a and 302b are provided for two separate semiconductor die in each final package.

A half-etched portion of leadframe 300 extends around die paddles 302 as die pads 306. Die pads 306 have a larger footprint than die paddles 302 to increase mold lock. Die pad 306a includes half-etched extension 307a that extends from die pad 306a to contact 304d. Contact 304d provides an external electrical connection to the surface of a semiconductor die in contact with die pad 306a. Similarly, extension 307b extends from die pad 306b to contact 304c to provide external connection to the back of a semiconductor die disposed on die pad 306b. Extension regions 307 coupling to contacts 304 allow contacts at the lateral edges of the final device to be used to connect to the back side of semiconductor die. Connecting to a contact 304 provides the added benefit of an externally visible solder fillet when the package is installed over connecting via die paddles 302.

Frame 308 surrounds each set of die pads 306a and 306b. Frame 308 can be half-etched as illustrated, or can remain at the full thickness of leadframe 300. Die pads 306 are coupled to frame 308 by die pad tie bars 310. Contacts 304 are coupled directly to frame 308 at the flanks of the contacts that will be exposed in the final leadless package. In addition, contacts 304 are electrically coupled to frame 308 by contact tie bars 311 and include half-etched wings 312. Independent tie bars 311 are provided to electrically couple individual contacts 304 to frame 308. Having independent tie bars for individual contacts allows the contacts to be electrically isolated from each other by simply singulating through saw streets 320 and 324. An additional trench within the package footprint is not required as with trenches 392 in FIG. 2g. Extensions 307 remain coupling respective die pads 306 to contacts 304 in the final package because trench 392 is not required. Trench 292, if used in the embodiment of FIGS. 3a-3i, would cut through extensions 307 along with any tie bars that were desired to be severed.

FIG. 3b illustrates leadframe 300 flipped left-right to view the leadframe from the top side. Semiconductor die 124 are disposed on die pads 306. Contact pads 132 of semiconductor die 124 are coupled to contacts 304 by bond wires 346.

In one embodiment, semiconductor die 124 are discrete vertical power MOSFETs or other similar three-terminal devices. Semiconductor die 124a might have a drain terminal directly electrically coupled to die pad 306a via the bottom surface of the semiconductor die, while contact pads 132 represent source and gate terminals. The drain of the power MOSFET would be coupled to terminal 304d by extension 307a, while the source and drain terminals would be coupled to contacts 304a and 304e by bond wires 346. Other functionality is provided by semiconductor die 124 in other embodiments.

Figure 3C:
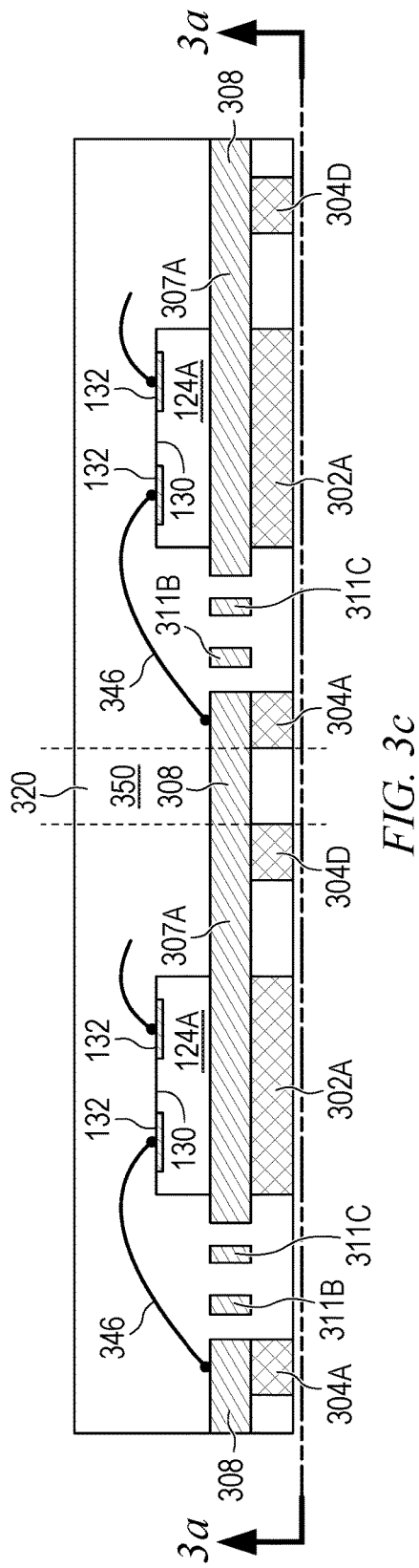
Figure 3D:
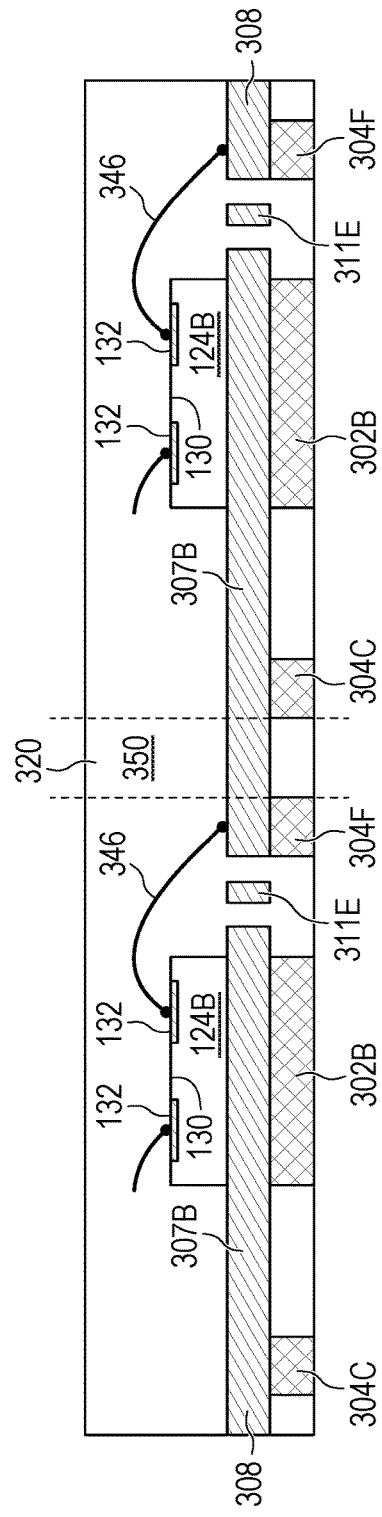

FIGS. 3c and 3d illustrate cross-sectional views of leadframe 300 through die paddles 302a and 302b, respectively, including encapsulant 350 deposited over leadframe 300, semiconductor die 124, and bond wires 346. Leadframe 300 is illustrated using different hatch patterns for the top and bottom halves of the leadframe to better illustrate half-etched portions. However, in most embodiments, the leadframe is a solid body of a uniform conductive material and no visible delineation would be seen. Tie bars 311b, 311c, and 311e are shown in the particular cross-sections, and extend into and out of the page. Contacts 304a, 304c, 304d, and 304f are isolated in the illustrated cross-sections, but are electrically coupled together by their respective connections to frame 308. Tie bars 311b, 311c, and 311e are all electrically connected to each other through frame 308 as well, and each electrically couples a respective contact 304 to the other contacts 304 through frame 308. Encapsulant 350 is similar to encapsulant 250, and extends under contact wings 312 and die pads 306 to increase mold lock of contacts 304 and die paddles 302.

Figure 3E:
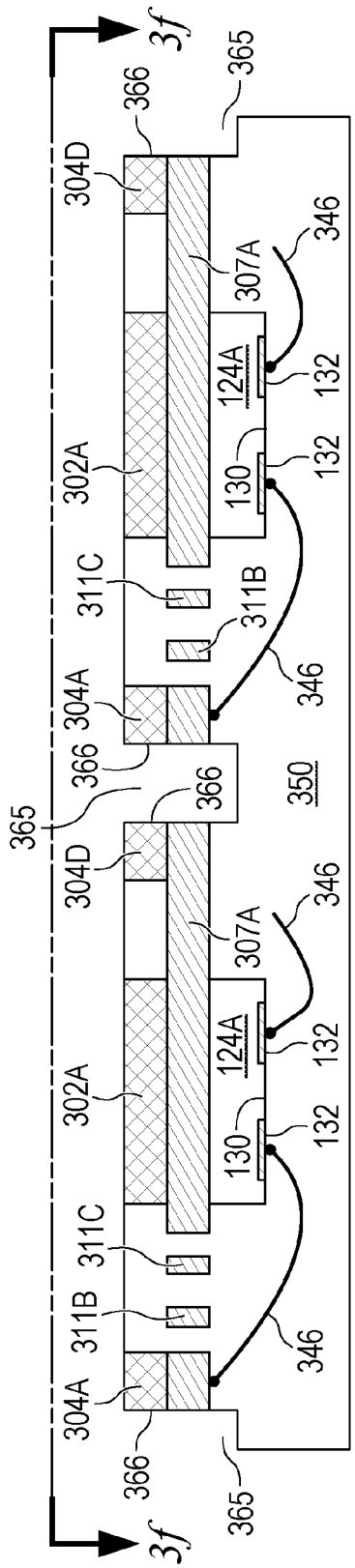

In FIG. 3e, trenches 365 are formed through saw streets 320 in a similar manner to trenches 265 in FIG. 2d. Trenches 365 can be formed either partially through or completely through encapsulant 350 within saw streets 320. Formation of trenches 365 exposes flanks 366 of each contact 304 for subsequent plating. In some embodiments, the full thickness portions of contacts 304 extend laterally into saw streets 320 and are partially removed in formation of trenches 365. FIG. 3f illustrates the same plan view from FIG. 3a after trenches 365 are formed. Encapsulant 350 is not illustrated so that leadframe 300 is fully visible.

Trenches 365 create vertical columns 370 of leadframe 300 that are electrically isolated from each other by the removal of frame 308 within saw streets 320. However, each unit within a common column 370 is electrically coupled together from top to bottom. A voltage potential applied at the bottom frame 308 portion flows to contact 304e through tie bar 311e and contact 304f through tie bar 311f. The voltage potential flows to die pad 306b through die pad tie bars 310, and further to contact 304c through extension 307b. The voltage potential flows from extension 307b through tie bar 311c to the next level horizontal frame 308 portion. From the second frame 308 portion, the voltage potential is applied through tie bar 311a to contact 304a and to contact 304b through tie bar 311b. The voltage potential also reaches contact 304d through extension 307a, die pad 306a, and die pad tie bars 310.

Figure 3G:
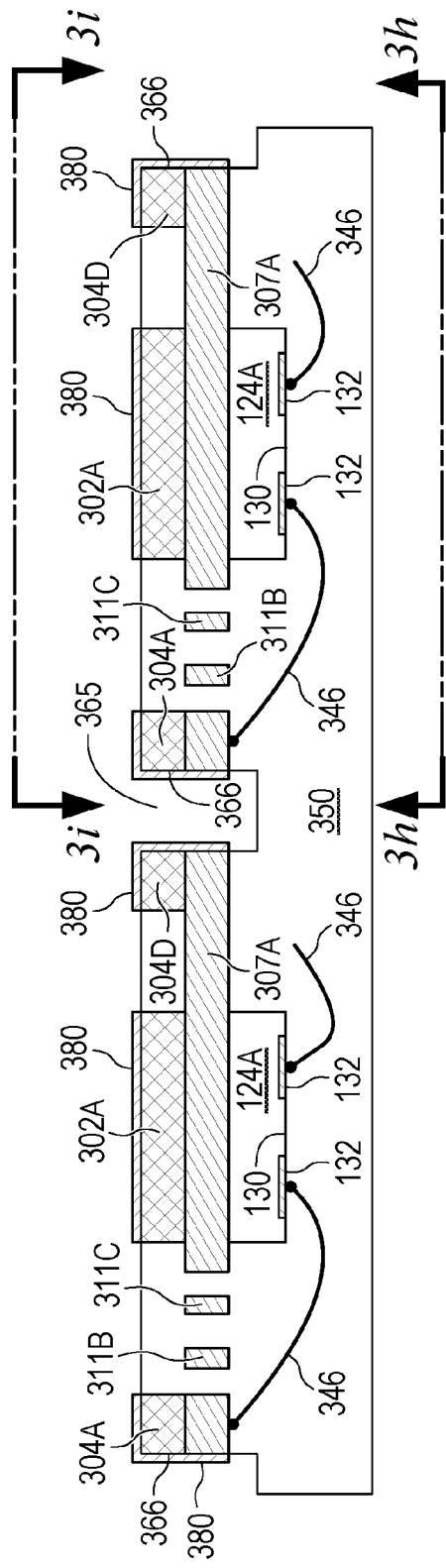
Figure 3F:
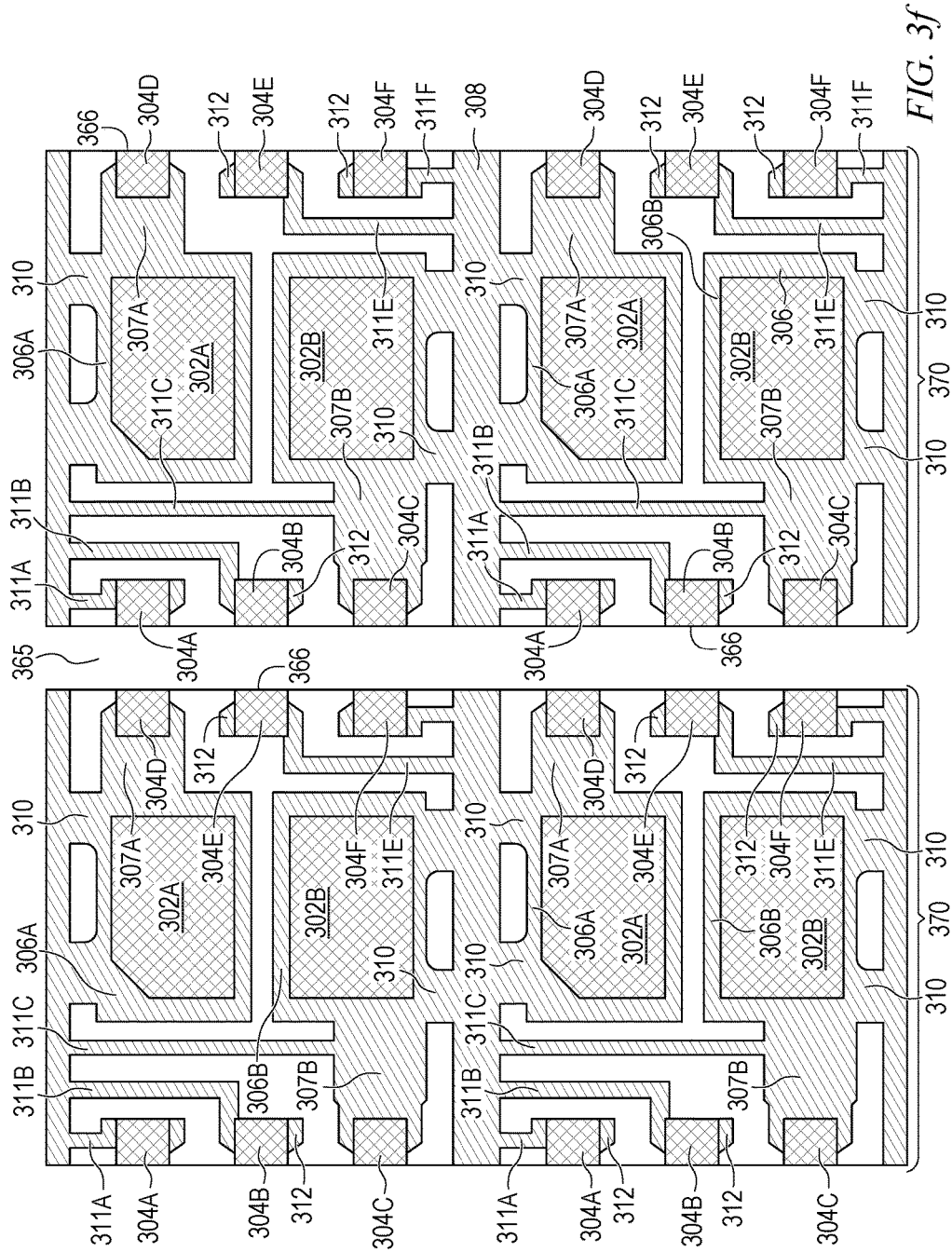

Full thickness flanks 366 of each contact 304 are exposed and electrically charged to allow metal in a plating bath to attach to leads 304 over a full thickness of leadframe 300 as conductive layer 380 in FIG. 3g. Conductive layer 380 is also plated onto the bottom surfaces of contacts 304 and die paddles 302 that are exposed from encapsulant 350.

Figure 3H:
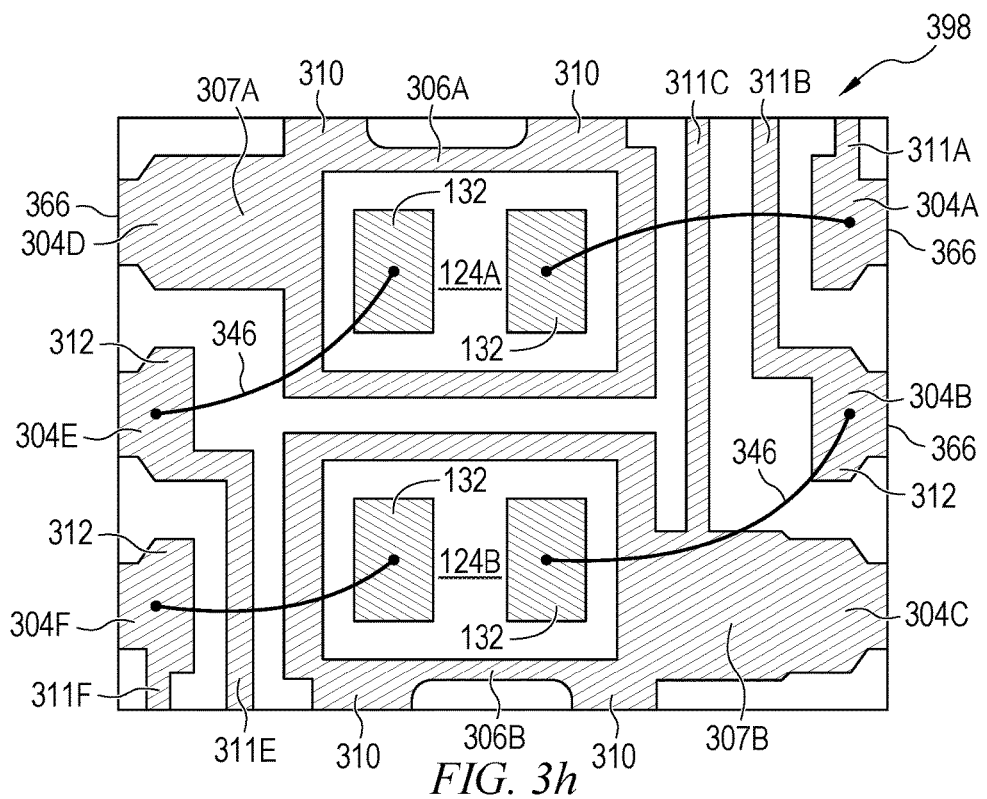
Figure 3I:
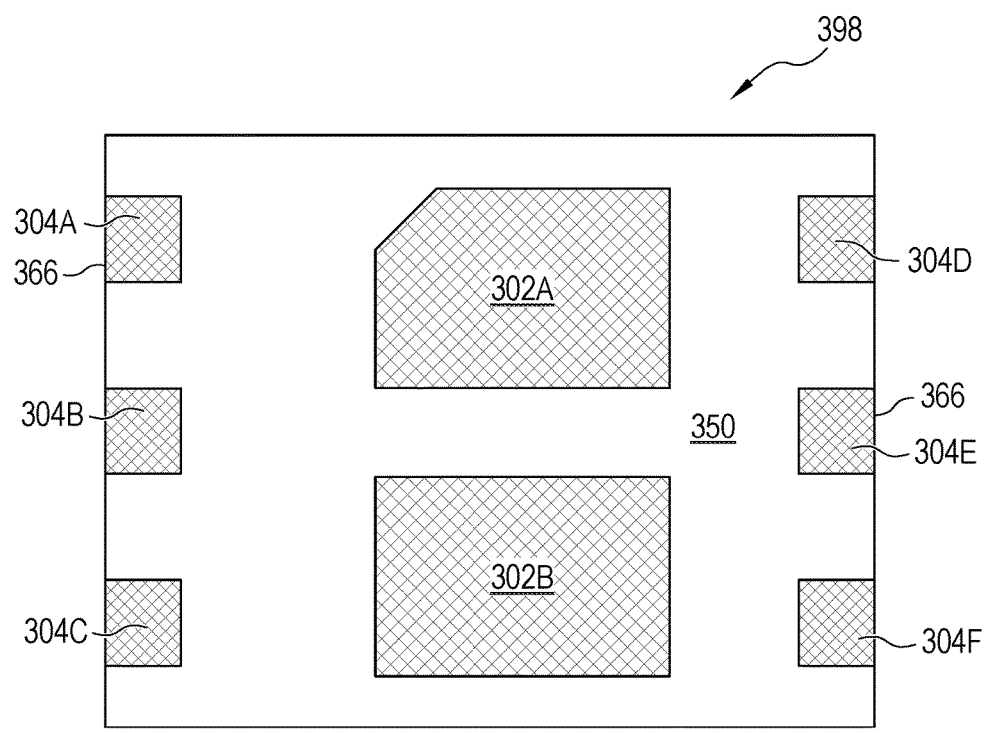

After plating layer 380 onto contacts 304 and die paddles 302, the panel of leadframe 300 and encapsulant 350 is fully singulated through saw streets 320 and 324 into separate leadless packages 398. In embodiments where trenches 365 were formed completely through encapsulant 350 prior to plating of conductive layer 380, a separate singulation step through saw streets 320 is not required. Only saw streets 324 are cut through after plating conductive layer 380. FIG. 3h illustrates a leadless package 398 in a top view without encapsulant 350, while FIG. 3i illustrates a leadless package 398 from a bottom view with the encapsulant illustrated. Contacts 304a-304f are each electrically isolated from each other by removal of frame 308 from around each package during singulation, and are only electrically connected per the functionality of semiconductor die 124 and an external system that incorporates package 398.

Die paddles 302a and 302b are exposed at the bottom of leadless package 398. Contacts 304c and 304d are also electrically connected to respective die pads 306 by respective extension regions 307. Contacts 304c and 304d provide electrical connections to the bottoms of semiconductor die 124 at the flanks of leadless package 398 so that the connection forms a fillet and is more easily verifiable using a visual system. Contacts 304a, 304b, 304e, and 304f are electrically coupled to respective contact pads 132 of semiconductor die 124. Each contact 304 includes a wettable flank 366 that is plated for the full thickness of leadframe 300, while also allowing multiple die paddles 302 to be coupled to leads 304 as desired.

Leadframe 300 provides a solution for multiple die pads coupled to contacts internally, but requires multiple tie bars 311 routed between contacts 304 and frame 308. One potential routing configuration is shown in FIGS. 3a-3i for a six terminal device. As the number of terminals per package increases, more independent tie bars 311 will have to be routed to frame 308. Eventually, the routing becomes problematic as the number of terminals grows.

Figure 4A:
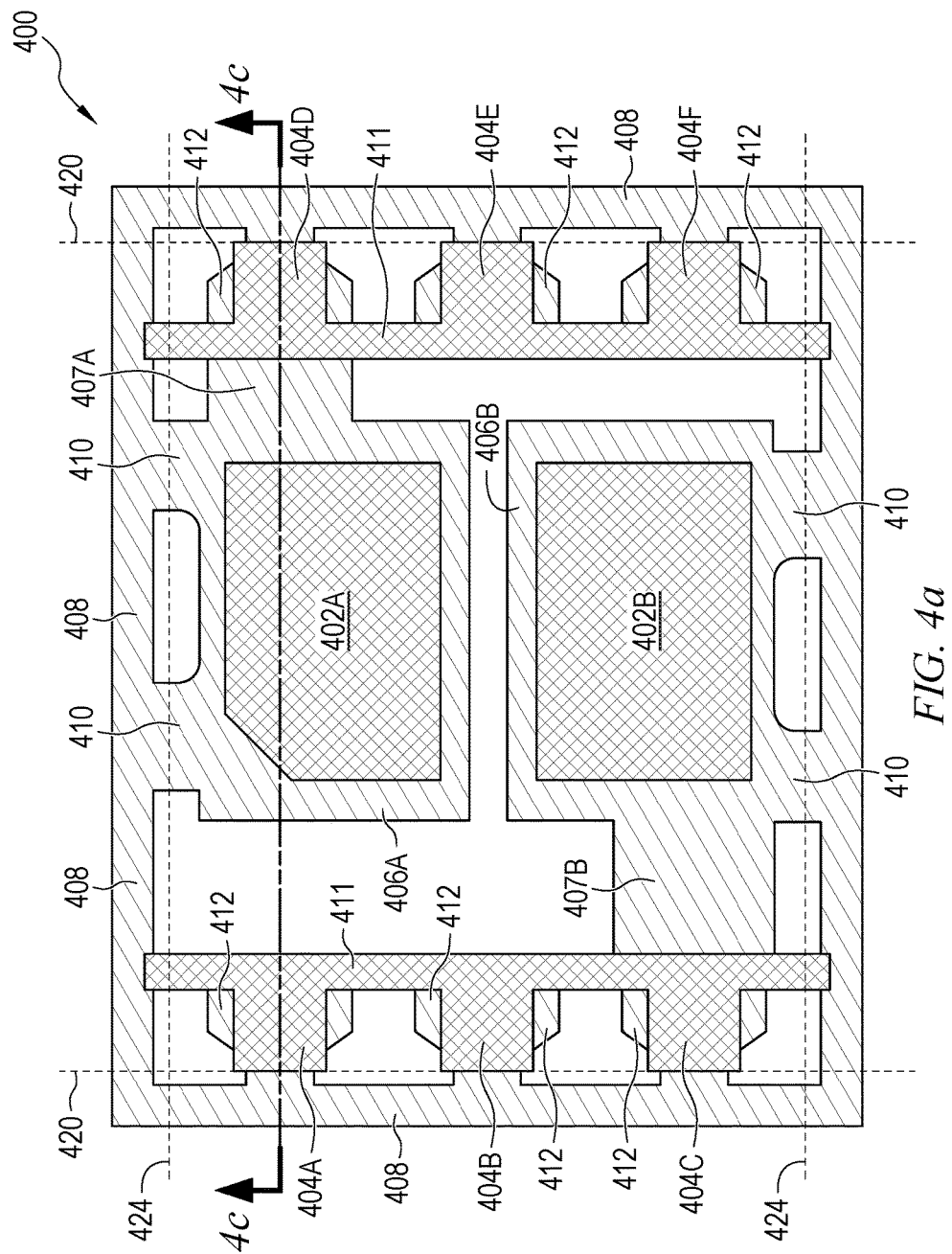
Figure 4B:
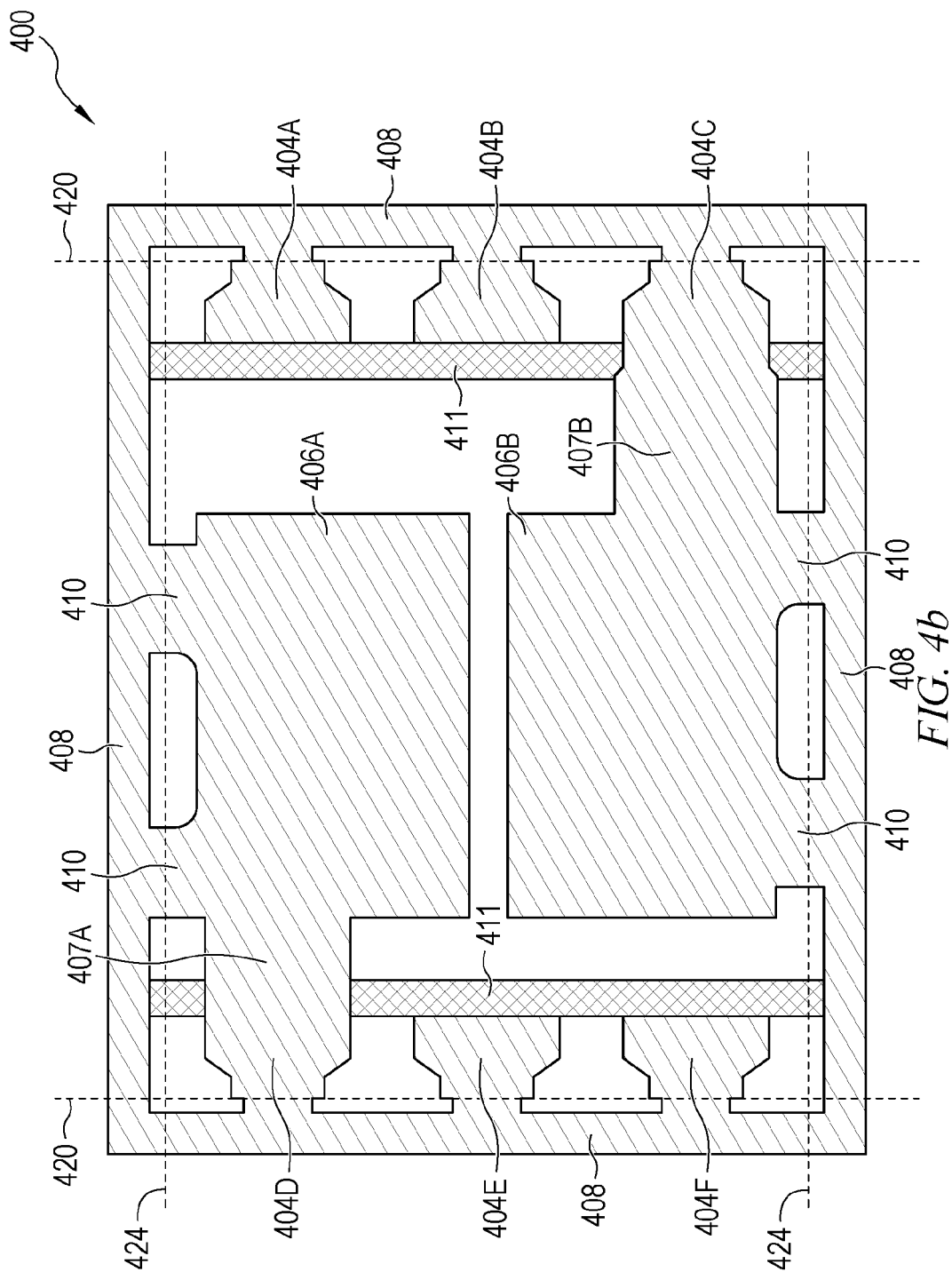

FIG. 4a illustrates a leadframe 400 that provides for separate die paddles 402 coupled to separate contacts 404 with a shared tie bar 411 between any number of contacts on a side of a package. FIG. 4a shows a bottom plan view of leadframe 400 for one package, while FIG. 4b illustrates a top plan view. As with the previous embodiments, a plurality of packages is formed at once by tessellating leadframe 400 across any desired length and width.

FIG. 4a shows a bottom view, with surfaces of die paddles 402, contacts 404, and tie bars 411 closer to the viewer than visible surfaces of the remaining portions of leadframe 400. As with previous embodiments, the bottom half of leadframe 400 is illustrated with square hatching, and the top half of leadframe 400 is illustrated with line hatching. Line hatching is visible in regions where leadframe 400 is half-etched from the bottom, but the top half of the leadframe is not etched. Die paddles 402, contacts 404, and tie bars 411 will all be exposed at a bottom surface of a panel after depositing encapsulant. In some embodiments, frame 408 is full-thickness rather than being half-etched, and will be exposed at the bottom surface of encapsulant 450 between units of leadframe 400. The rest of leadframe 400 will have encapsulant deposited between the leadframe and the viewer in the angle of FIG. 4a. While tie bars 411 are shown ending at frame 408, tie bars 411 may extend uniformly across each aligned unit of the larger leadframe 400 when a larger leadframe is used to make multiple units at once.

FIG. 4b shows that tie bars 411 are half-etched from the top of leadframe 400 except for within extension regions 407, which are not etched from the top side of the leadframe. The areas where extension regions 407 cross tie bars 411 remain at the full thickness of leadframe 400. In FIG. 4b, the square hatching of tie bars 411 indicates regions where leadframe 400 is half-etched from the top, and the bottom half of the leadframe remains.

Contact tie bars 411 extend across an individual unit of leadframe 400 to electrically couple an entire column of contacts 404 to frame 408. Any number of contacts 404 can be added to a side of a package, and tie bar 411 is simply extended in length to reach the added contacts.

A semiconductor die 124 is disposed on each die pad 406, and contact pads 132 are coupled to contacts 404 by bond wires 446 in FIG. 4c. Encapsulant 450 is deposited over leadframe 400, semiconductor die 124, and bond wires 446 to form a panel. Die paddle 402, contact pads 404, and tie bars 411 remain exposed from encapsulant 450 because leadframe 400 is on a carrier or other substrate while the encapsulant is deposited.

Figure 4D:
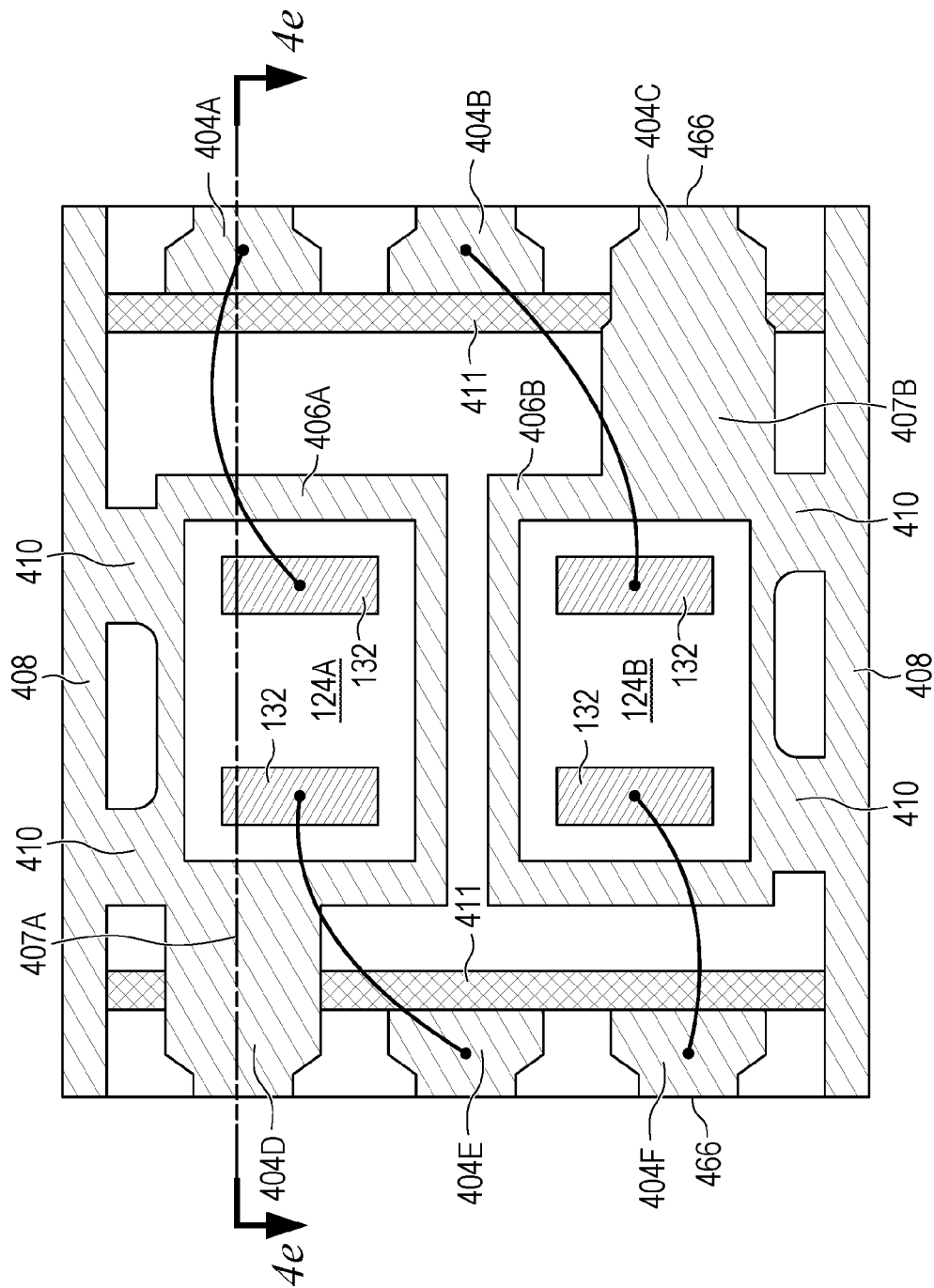

In FIGS. 4d-4e, trenches 465 are formed in saw streets 420 to remove portions of frame 408 and expose flanks 466 of contacts 404 for plating. Trenches 465 extend partially through encapsulant 450 as illustrated, or extend completely through encapsulant 450 in other embodiments. Contacts 404 remain electrically coupled to each other through tie bars 411 and remaining portions of frame 408. Vertically aligned units remain electrically coupled to each other through the remaining portions of frame 408. Horizontally aligned units remain physically coupled to each other across saw streets 420 by encapsulant 450 in embodiments where trench 465 does not extend completely through the encapsulant. In embodiments where trench 465 extends completely through encapsulant 450, horizontally aligned units remain physically coupled by being on a common carrier or substrate.

FIG. 4e illustrates plated conductive layer 480 over exposed surfaces of die paddle 402 and contacts 404. Conductive layer 480 forms on each contact 404 because an applied voltage potential reaches each contact through tie bars 411. Conductive layer 480 forms on flanks 466 for the entire vertical extent of leadframe 400 because trench 465 completely exposes the full thickness portions of contacts 404.

Figure 4G:
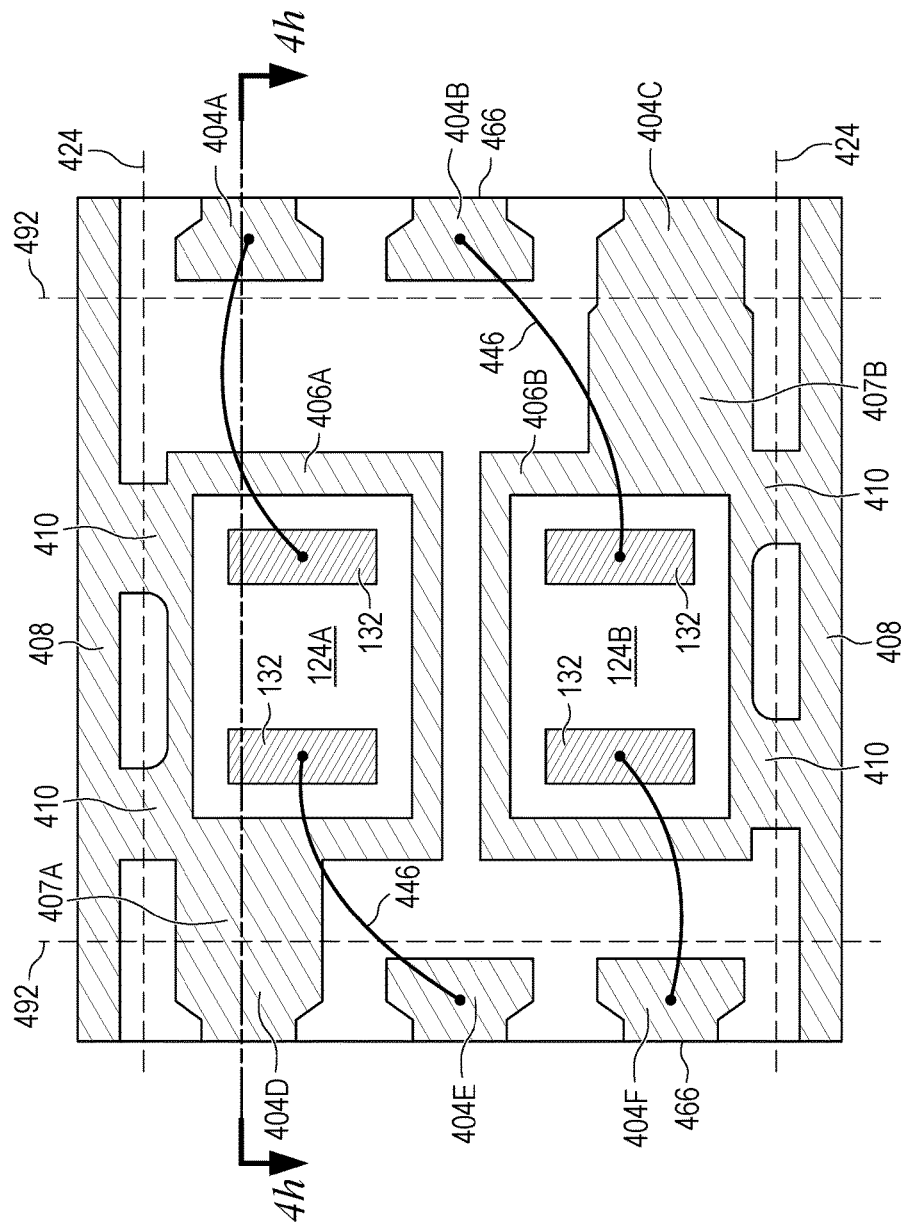

In FIGS. 4f-4g, a saw blade or laser cutting tool is used to form trenches 492, removing tie bars 411. Trenches 492 are formed only to the half-etched thickness of leadframe 400 to fully remove tie bars 411 without cutting completely through the leadframe. Extension regions 407 remain electrically coupling die pad 406a to contact 404c and die pad 406b to contact 404b. Extension regions 407 are not cut by trenches 492 because the trenches only extend through the bottom half of the leadframe 400 thickness, while extension regions 407 exist within the top vertical half of the leadframe.

Figure 4I:
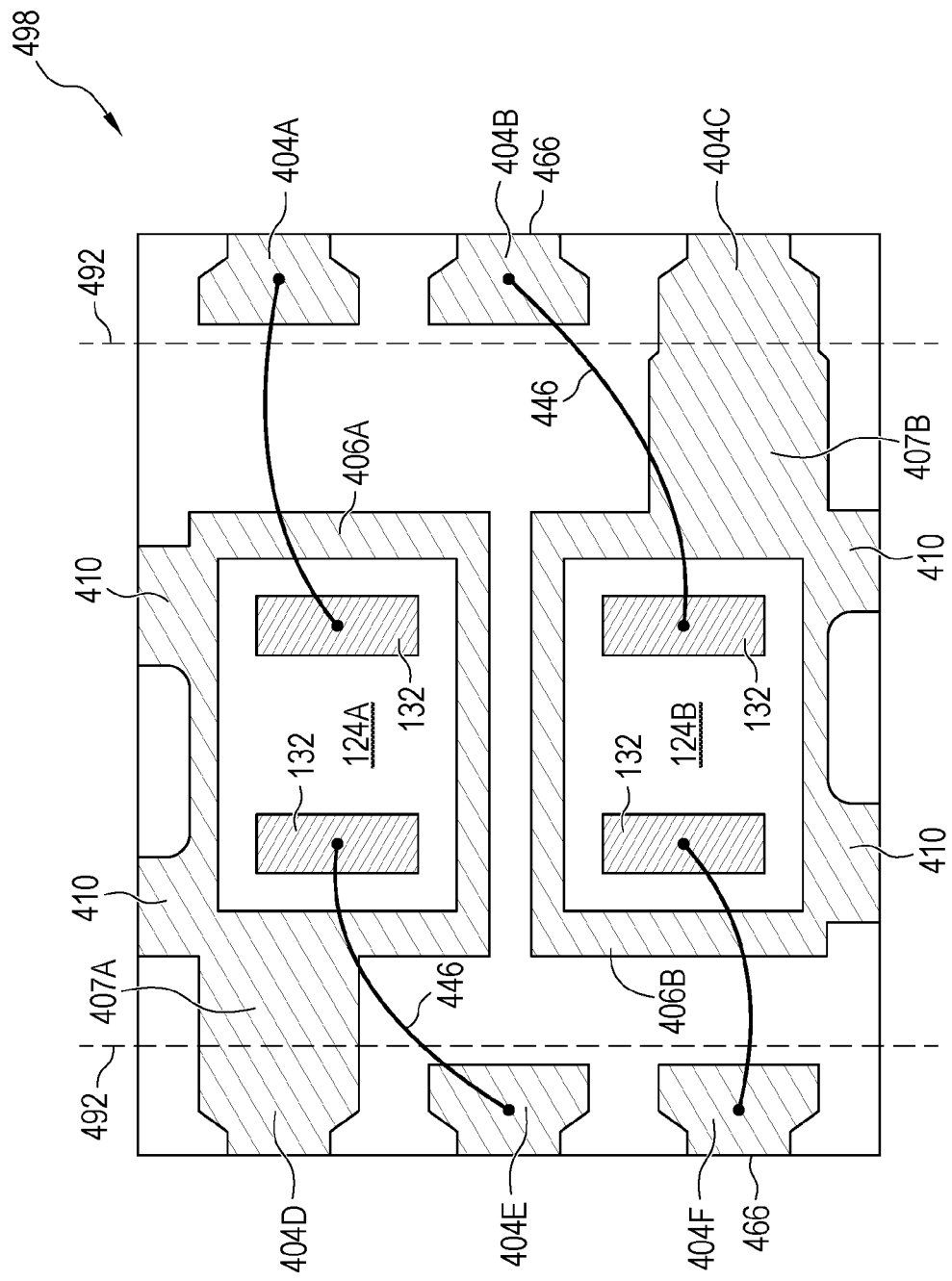
Figure 4J:
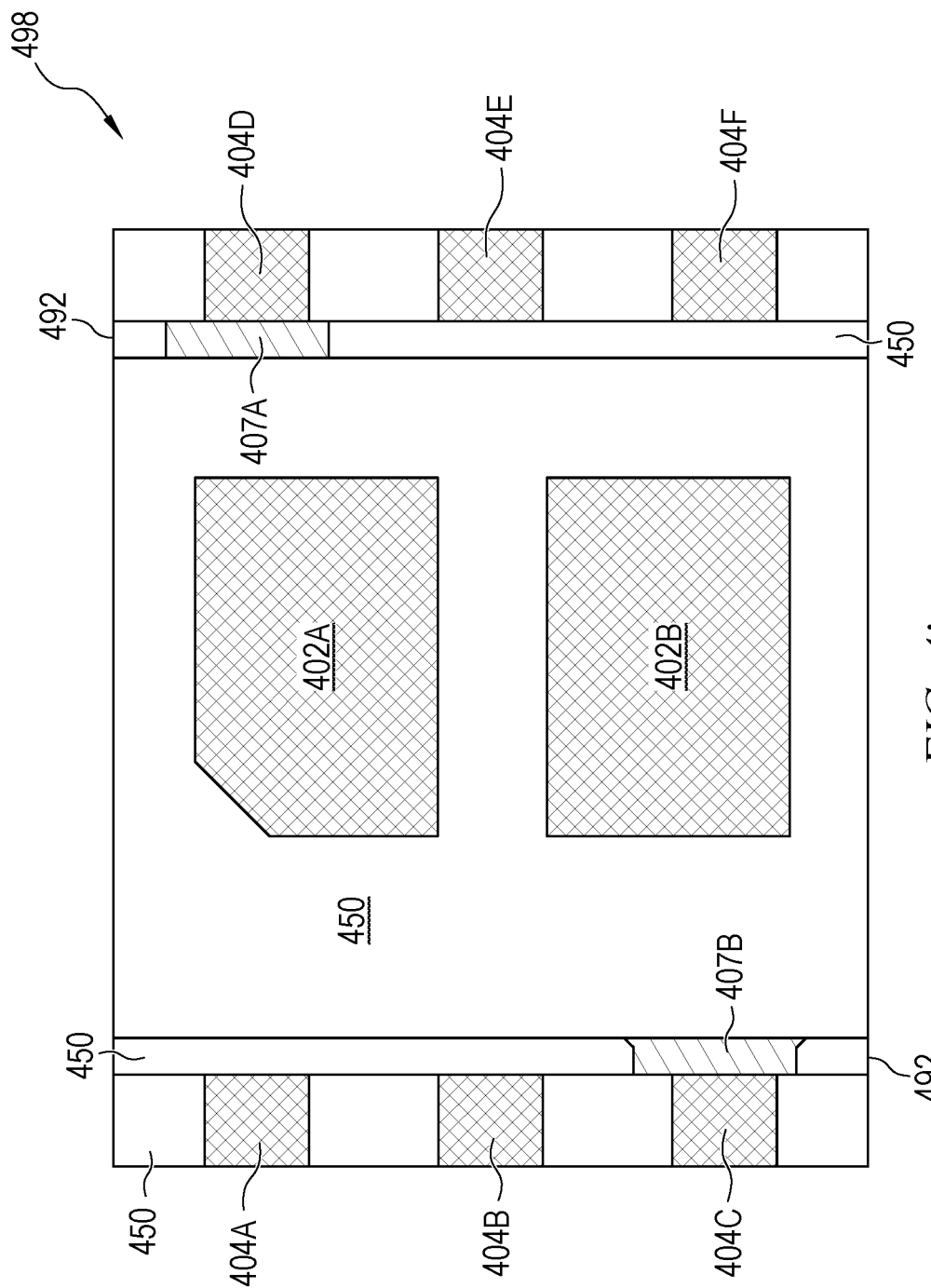

FIGS. 4h-4j illustrate leadless package 498 after full singulation through saw streets 420 and 424 using a saw blade or laser cutting tool. In embodiments where trenches 465 were formed completely through encapsulant 450, only saw streets 424 are singulated after plating of conductive layer 480. FIG. 4h is a cross-sectional view. FIG. 4i is a top-down view without encapsulant 450 illustrated to show leadframe 400 and semiconductor die 124. FIG. 4j is a bottom-side view with die paddles 402 and contacts 404 exposed.

FIG. 4h illustrates plated conductive layer 480 extending over flanks 466 of contacts 404 for the entire vertical thickness of leadframe 400. Conductive layer 480 is also plated onto the bottom surfaces of die paddles 402 because the die pads are exposed and electrically coupled to contacts 404 during plating. Contact pads 132 of semiconductor die 124 are coupled to contacts 404 by bond wires 446. The back surfaces of semiconductor die 124 are electrically coupled to other contacts 404 through die pads 406 and extension regions 407.

FIG. 4j shows die paddles 402 and contacts 404 exposed at the bottom surface of leadless package 498. Die paddle 402a includes a corner cut-out to indicate orientation. Trenches 492 are illustrated where tie bars 411 were removed. Encapsulant 450 is visible in the trenches because removal of tie bars 411 completely removes leadframe 400 except where extension regions 407 remain. Extension regions 407 are visible in trenches 492 because leadframe 400 was full thickness in those areas, but the saw blade that created trenches 492 only cut into the package for half the thickness of the leadframe. Leadframe 400 with tie bars 411 allowed a package 498 to be created having any number of contacts with flanks plated for the full thickness of the leadframe.

Figure 5A:
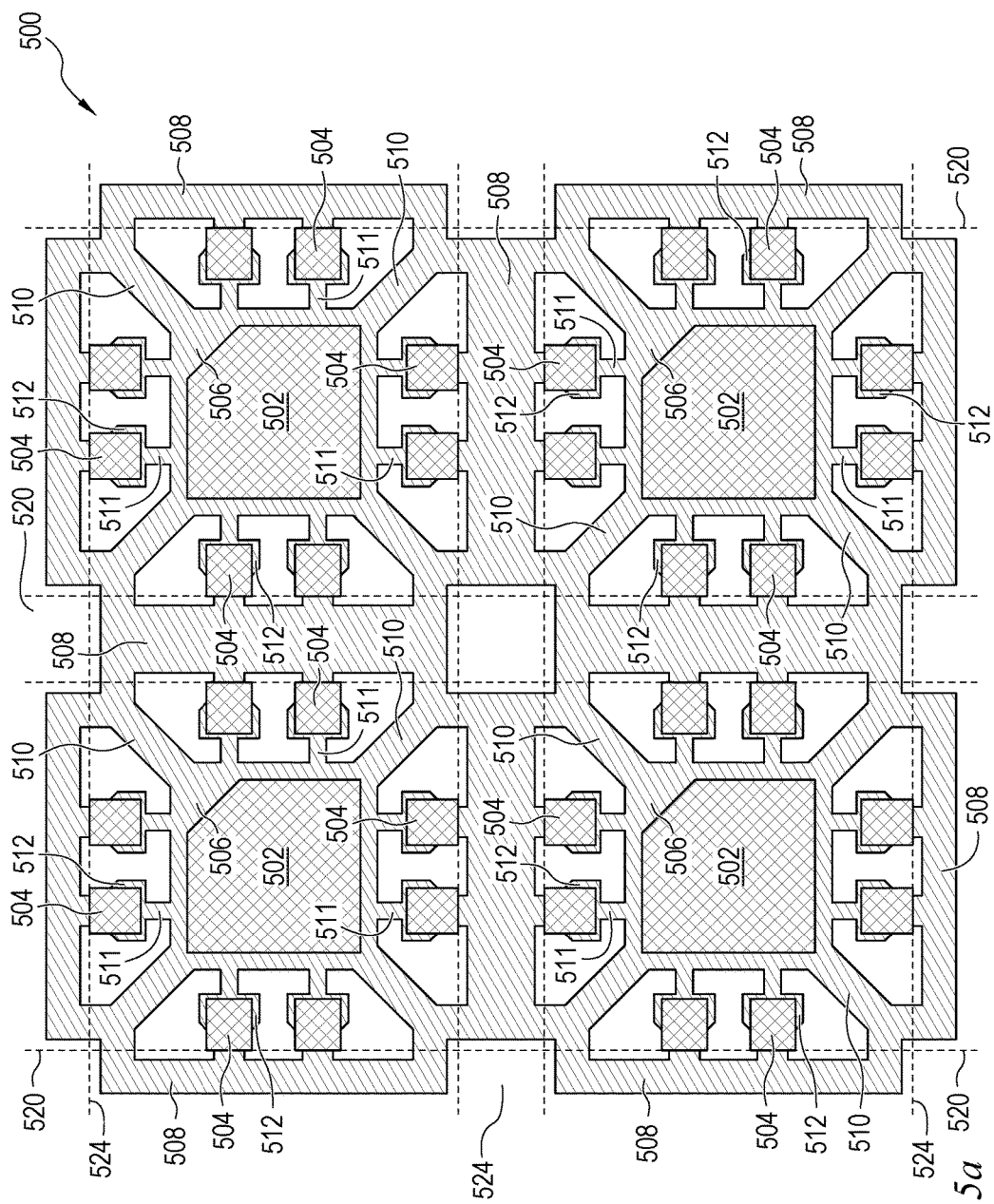

FIGS. 5a-5j illustrate forming a quad flat non-leaded (QFN) package using similar concepts to the above embodiments. FIG. 5a illustrates the bottom side of a leadframe 500. Die paddles 502 and contacts 504 extend closer to the viewer than the remainder of leadframe 500, which is half-etched from the bottom. Die paddles 502 are rectangular with a corner missing for orientation. Each unit of leadframe 500 includes a die paddle 502 and contacts 504 adjacent to all four sides of the die paddles. Die pads 506 surround die paddles 502 for increased mold lock, and frame 508 surrounds each unit of leadframe 500 within saw streets 520 and 524. As with previous embodiments, frame 508 can be half-etched or remain at the full thickness of leadframe 500. Die pad tie bars 510 extend from corners of die pads 506 to frame 508 to provide electrical and physical coupling for the die pads. Contact tie bars 511 extend from contacts 504 to die pads 506 to provide electrical and physical coupling of the contacts. Contacts 504 are also directly coupled to frame 508 opposite tie bars 511. Contacts 504 include half-etched wings 512 for mold lock.

Figure 5B:
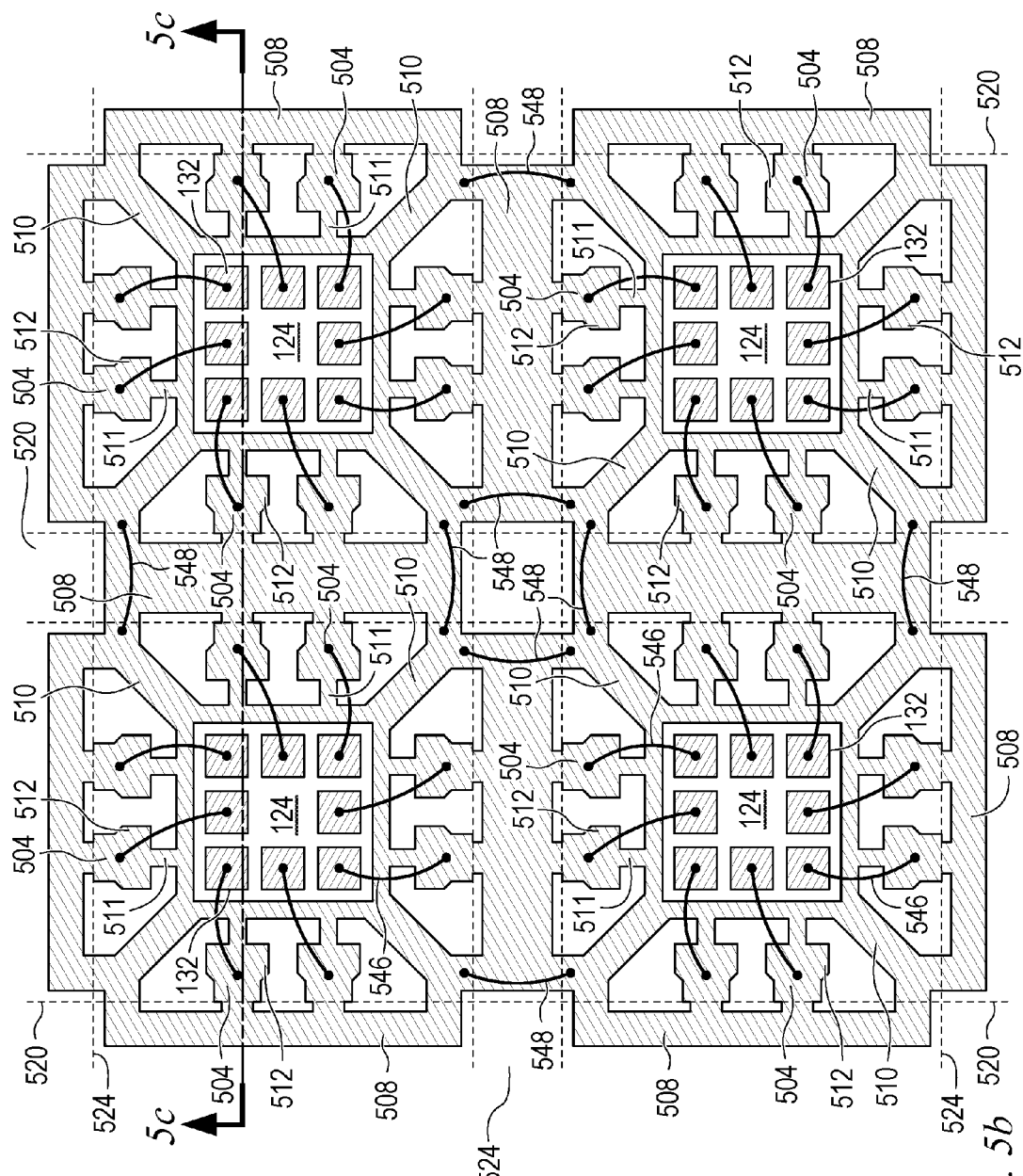

FIG. 5b illustrates leadframe 500 flipped to view the top side of the leadframe with semiconductor die 124 mounted on die pads 506. Wire bonds 546 electrically couple contacts 504 to contact pads 132 of semiconductor die 124. Wire bonds 548 electrically couple die pad tie bars 510 across saw streets 520 and 524 so that electrical current reaches each unit of leadframe 500 even after frame 508 is removed to expose flanks of contacts 504 for plating.

FIG. 5c illustrates a cross-sectional view of leadframe 500 and semiconductor die 124 with encapsulant 550 forming a panel. While bond wire 548 would not be visible in the illustrated cross-section, bond wire 548 is included as a dotted line to help illustrate its function.

Figure 5D:
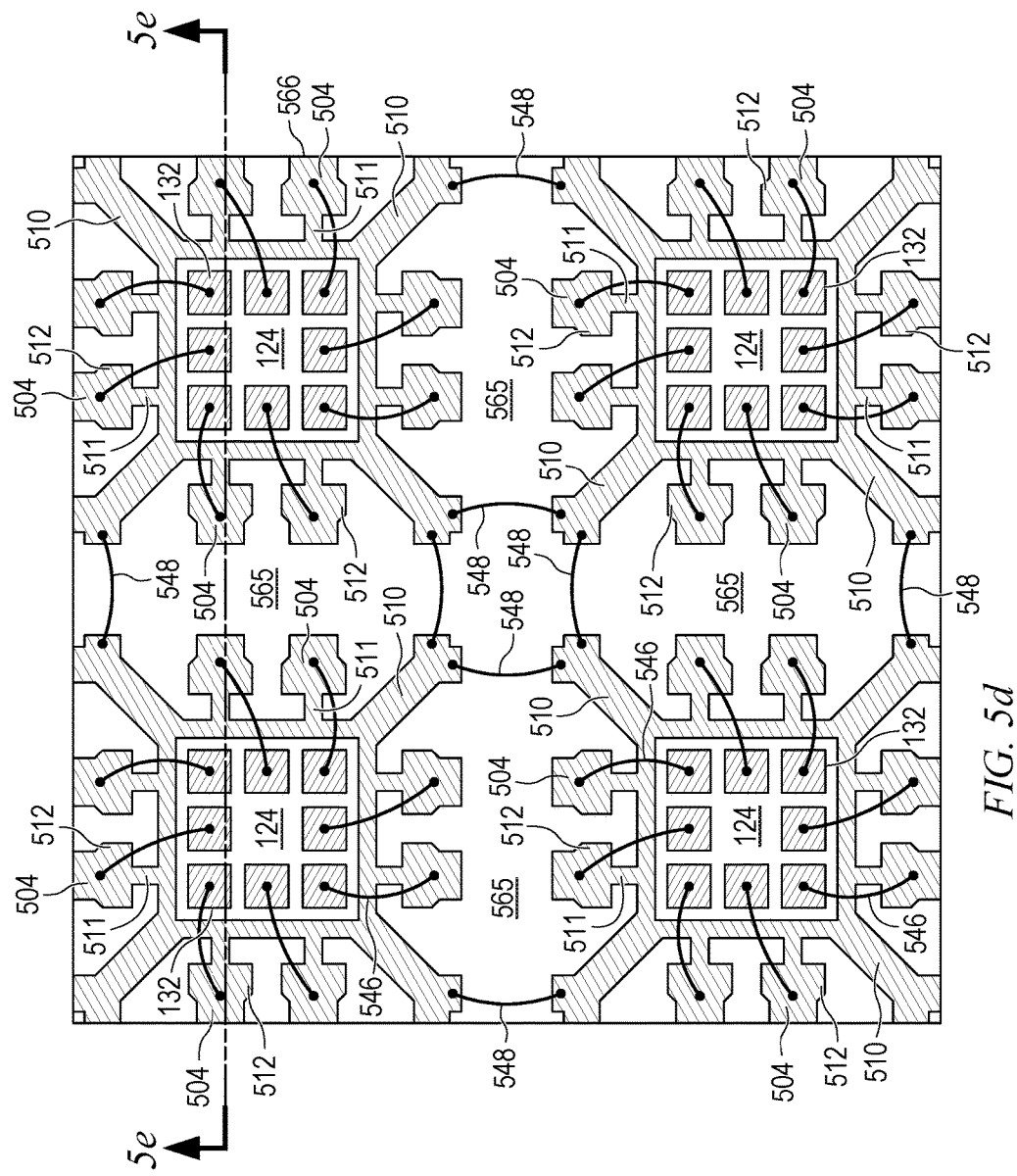

In FIGS. 5d-5e, frame 508 is removed by forming trenches 565 through leadframe 500 using a saw blade or laser cutting tool. Trenches 565 extend completely through leadframe 500 but do not extend fully through encapsulant 550 nor cut through bond wires 548. Each contact 504 on each side of die pad 506 includes a flank 566 that is exposed for the full thickness of leadframe 500. Contacts 504 within a common unit of leadframe 500 are electrically coupled to each other by contact tie bars 511 connecting each contact to die pad 506. Each unit remains electrically coupled to adjacent units by bond wires 548. Each unit remains physically coupled to adjacent units by encapsulant 550 remaining within saw streets 520 and 524.

Bond wires 548 electrically couple units that are adjacent in the vertical direction as well as the horizontal direction. Having electrical continuity in each direction allows a voltage potential to be applied at a single point on leadframe 500 for plating, and the voltage potential will propagate across the entire leadframe. In cases where a voltage potential is applied by a track contacting each vertical column of units, the horizontal bond wires 548 are optional and provide a degree of redundancy. The electric potential reaching each die paddle 502 and contact 504 results in a plated conductive layer 580 that covers each exposed surface of the die paddles and contacts.

Figure 5F:
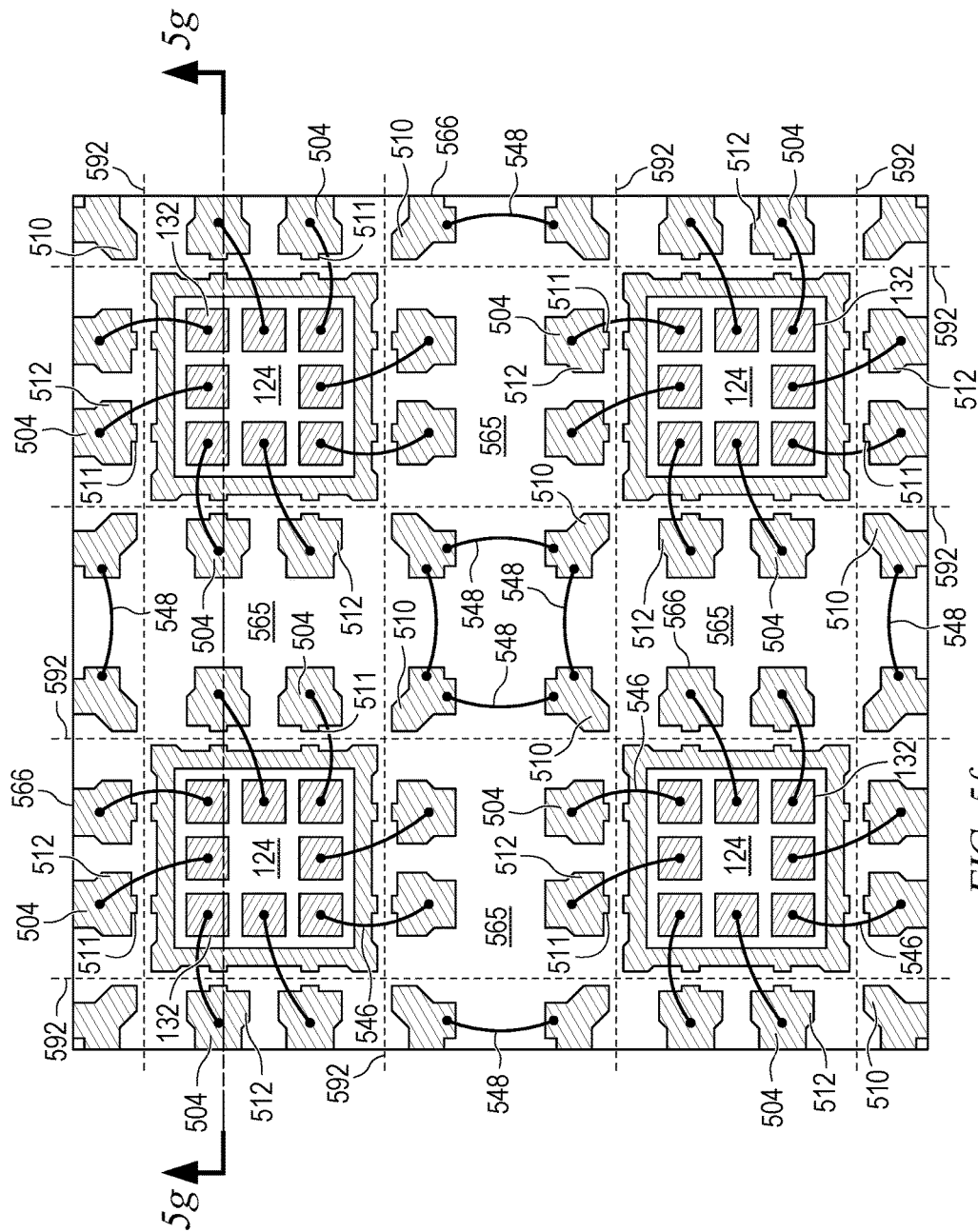

FIGS. 5f-5g illustrate trenches 592 formed through tie bars 510 and 511 using a saw blade or laser cutting tool. Trenches 592 separate contacts 504 from die pad 506 so that the contacts can be used to electrically interact with semiconductor die 124 without being short-circuited to each other through the die pad. The design of leadframe 500 allows trenches 592 to be formed extending across the entire leadframe while avoiding cutting through contacts 504 and die pads 506.

Figure 5J:
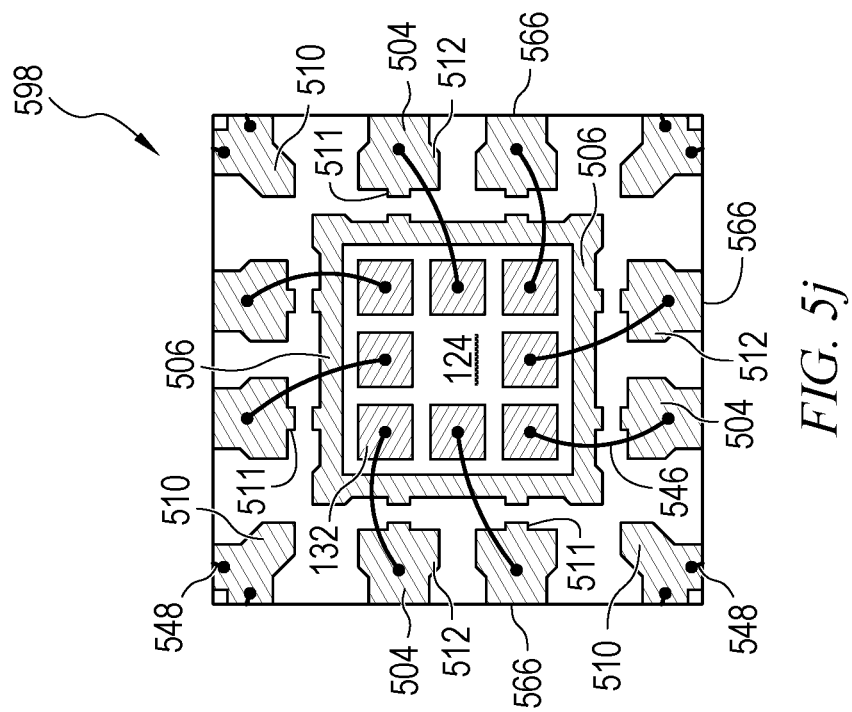
Figure 5I:
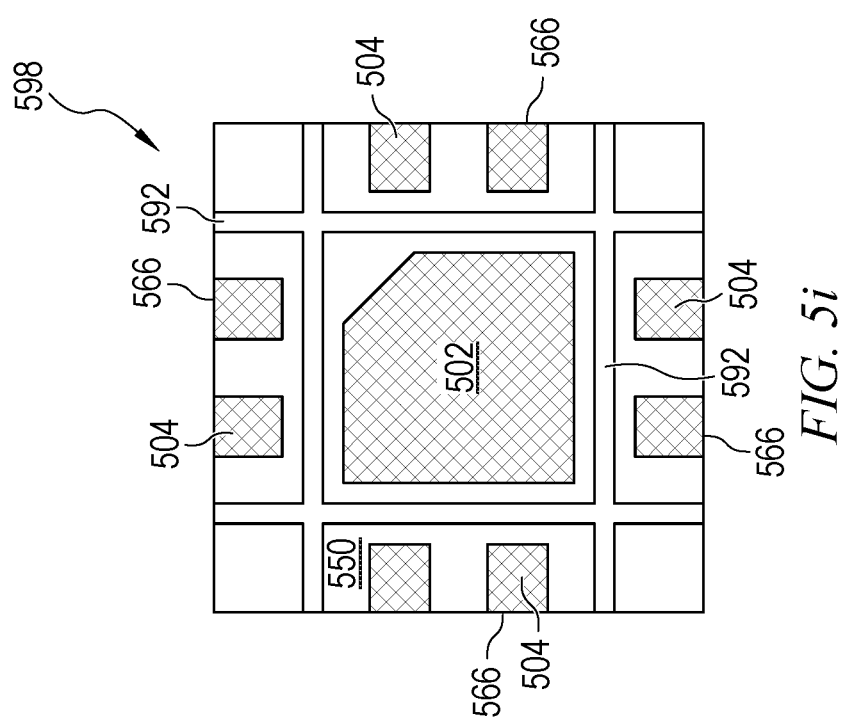

Next, leadframe 500 and encapsulant 550 are fully singulated through saw streets 520 and 524 to create individual leadless packages 598 as shown in FIG. 5h-5j. FIG. 5h illustrates a cross-section two adjacent units after being singulated through saw streets 520 and 524. FIG. 5i shows the bottom side of a package 598 with die paddle 502 and contacts 504 exposed from encapsulant 550. FIG. 5j illustrates a top-down view without encapsulant 550. The singulation of packages 598 cuts through bond wires 548 to electrically isolate each adjacent unit of leadframe 500. Each package 598 includes leads on every side of the package plated to the full height of leadframe 500.

Figure 6A:
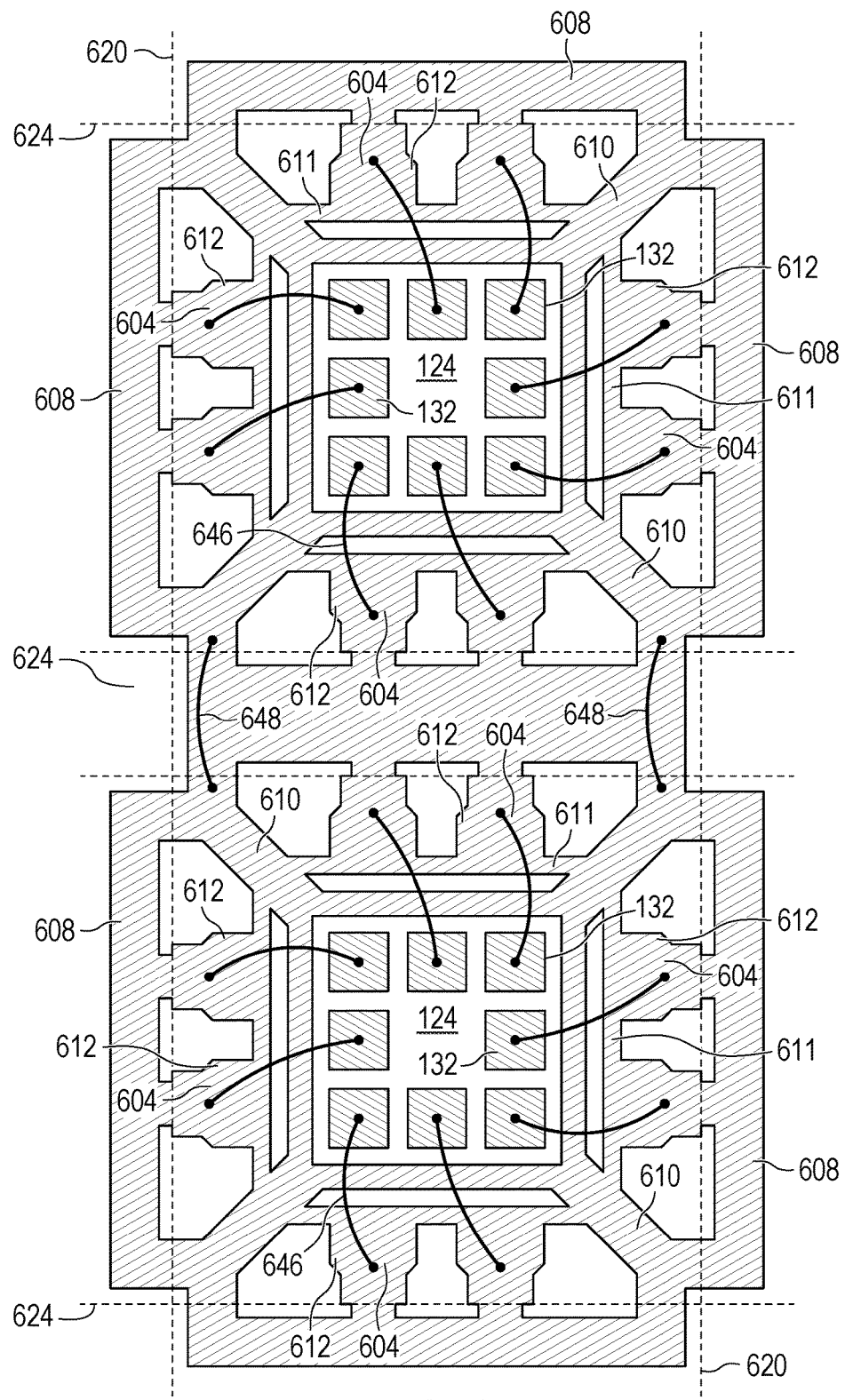
FIGS. 6a-6b illustrate forming a QFN package with shared tie bars for the leads.
Figure 6B:
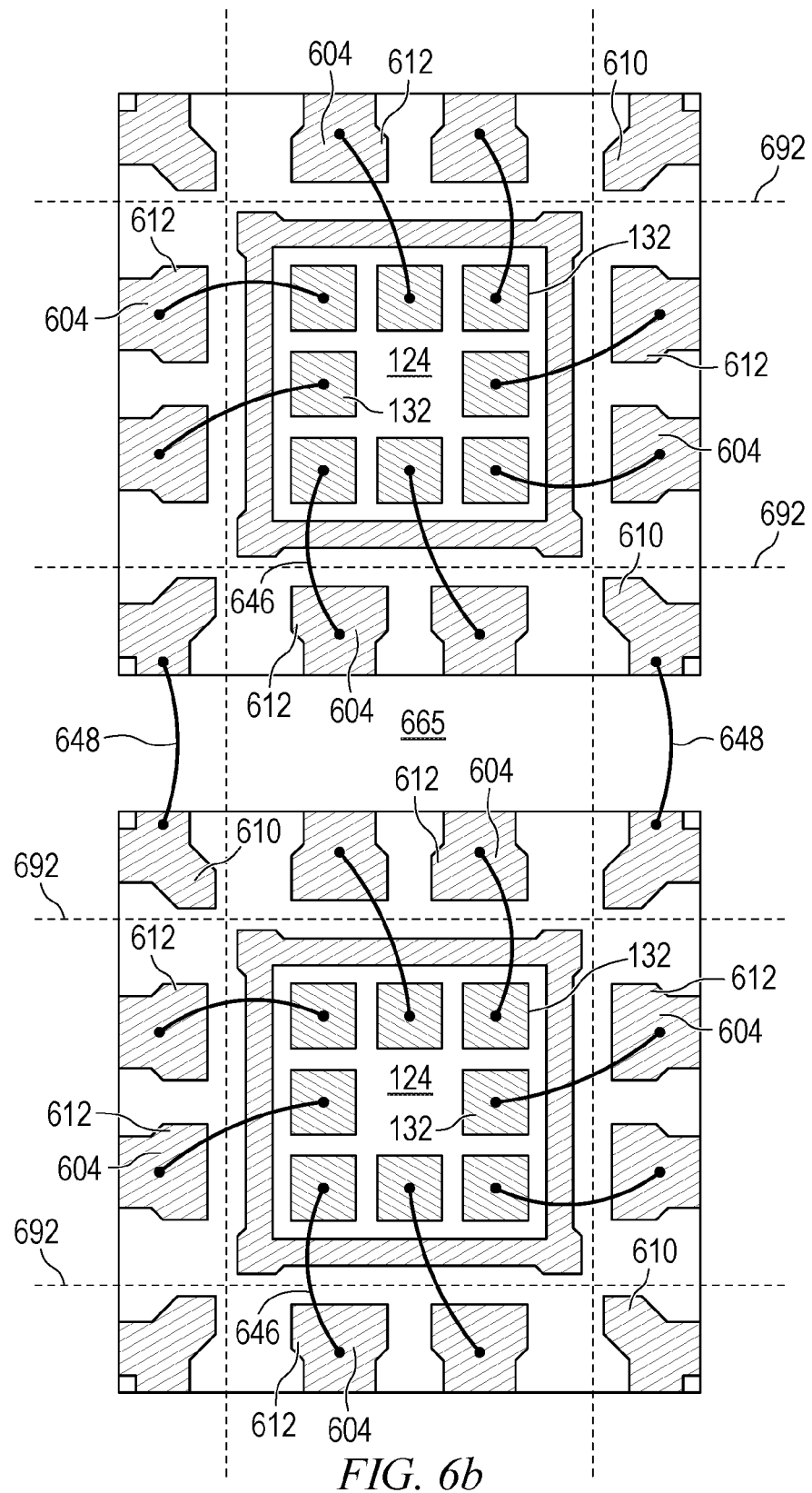

FIGS. 6a-6b illustrate an embodiment similar to FIGS. 5a-5j, but with contact tie bars 511 replaced with contact tie bars 611. Tie bars 611 extend along each side of die pads 606 between adjacent die pad tie bars 610 without directly contacting the die pads. Formation of leadless packages using leadframe 600 proceeds similarly as with leadframe 500 above. Trenches 692 run parallel to tie bars 611 and completely remove the tie bars, whereas tie bars 511 ran perpendicular to trenches 592 and were cut through. Trench 692 does not expose die pad 606 when tie bars 611 are used. Not having die pad 606 and contacts 604 exposed within trench 692 across from each other helps reduce the likelihood of conductive material inadvertently falling in the trench and creating a short circuit. Much like the previous embodiments, leadframe 600 creates a leadless package with plating on each lead for the full height of leadframe.

Figure 7A:
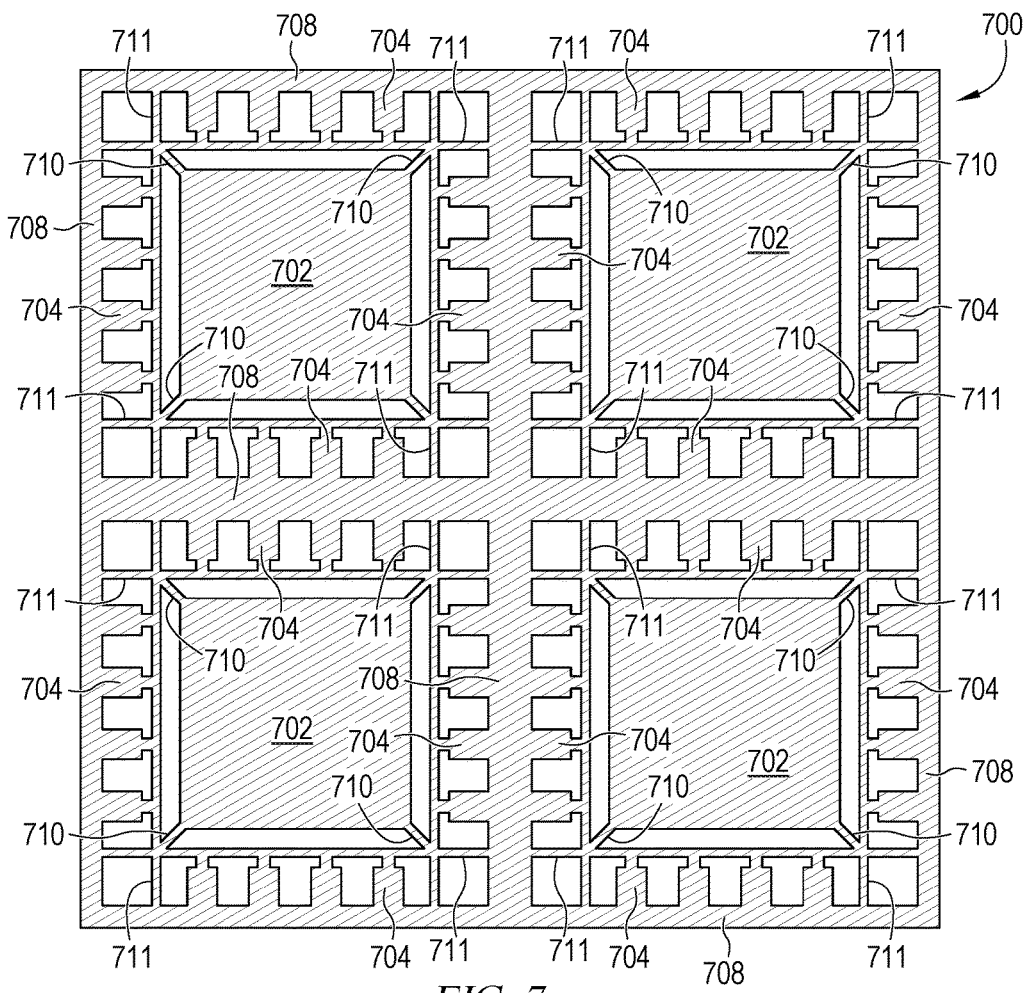
FIGS. 7a-7f illustrate an alternative leadframe and process for forming a QFN package with shared tie bars.

FIGS. 7a-7f illustrate QFN leadframe 700 with tie bars 711 that extend linearly between opposite portions of frame 708. FIG. 7a is a bottom view of leadframe 700 at the beginning of manufacturing a QFN package. In the illustrated embodiment, die pad 702 and contacts 704 are the full thickness of leadframe 700 while the other remaining portions are half-cut. Frame 708 surrounds each individual unit. Each unit includes a die pad 702 and sixteen contacts 704 surrounding the die pad, four contacts to a side. Die pad tie bars 710 attach die pad 702 to contact tie bars 711, which are attached to frame 708.

Figure 7B:
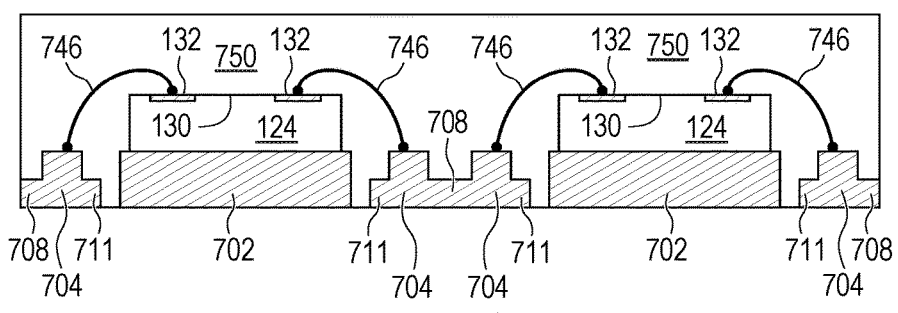

FIG. 7b illustrates a cross-sectional view of leadframe 700 with semiconductor die 124 disposed on die pads 702. Bond wires 746 electrically couple contact pads 132 to contacts 704. Die pads 702 and contacts 704 are exposed from a bottom surface of encapsulant 750. Leadframe 700 is oriented on a carrier with tie bars 711 against the carrier, so the tie bars are exposed at the bottom surface of encapsulant 750 along with contacts 704 and die pad 702. In other embodiments, leadframe 700 is oriented upside down relative to FIG. 7b, so that encapsulant 750 flows under tie bars 711. In some embodiments, die pad 702 includes a wider die pad and a narrower die paddle, and contacts 704 include wings, as with the previous embodiments, to improve mold lock. Any of the previous embodiments can be formed using simpler die pads and contacts, such as those shown in FIGS. 7a-7b. Any of the previous embodiments can be formed with tie bars exposed from encapsulant as shown in FIG. 7b. In other embodiments, leadframes are not half etched, but each part of the leadframe remains the full leadframe thickness.

Figure 7C:
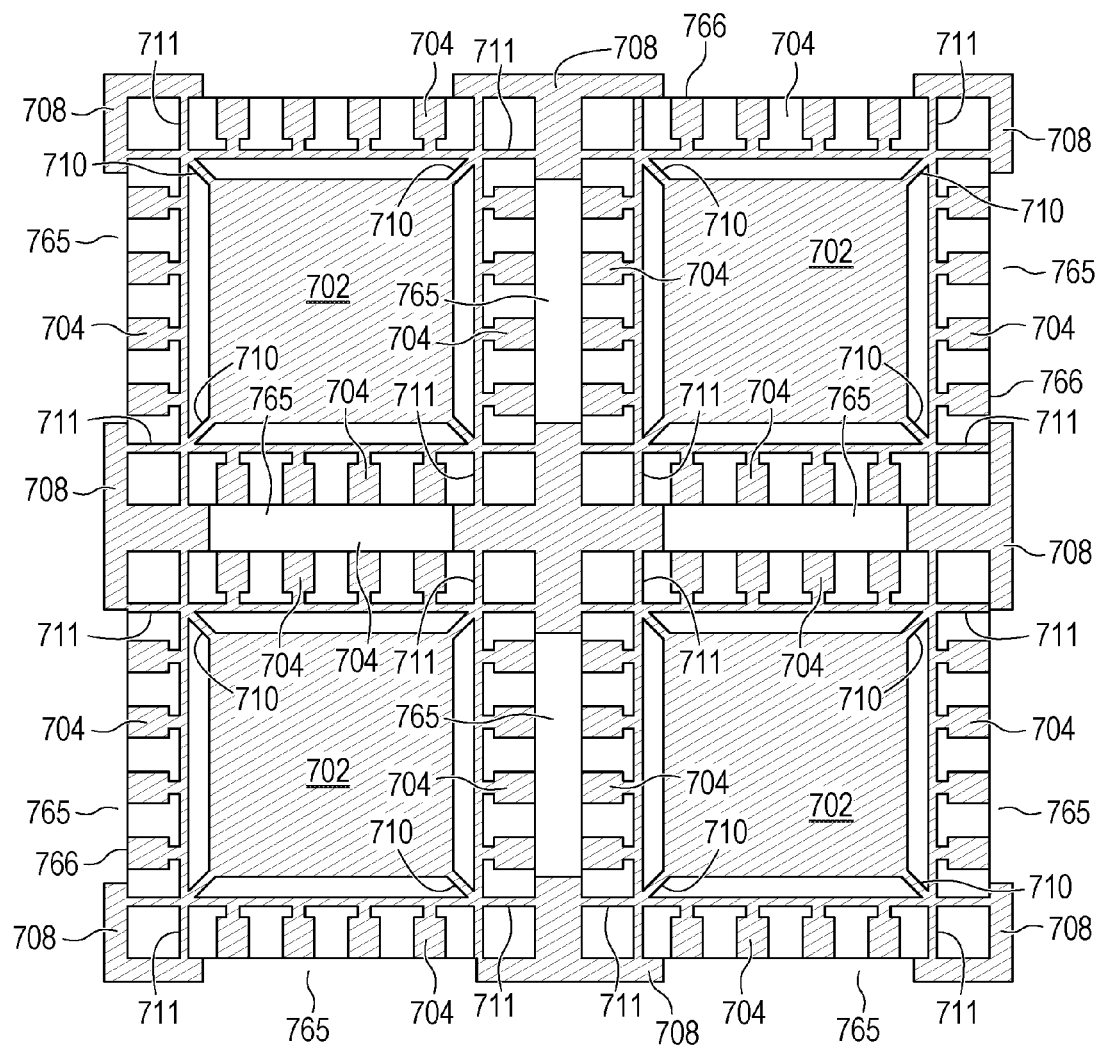
Figure 7D:
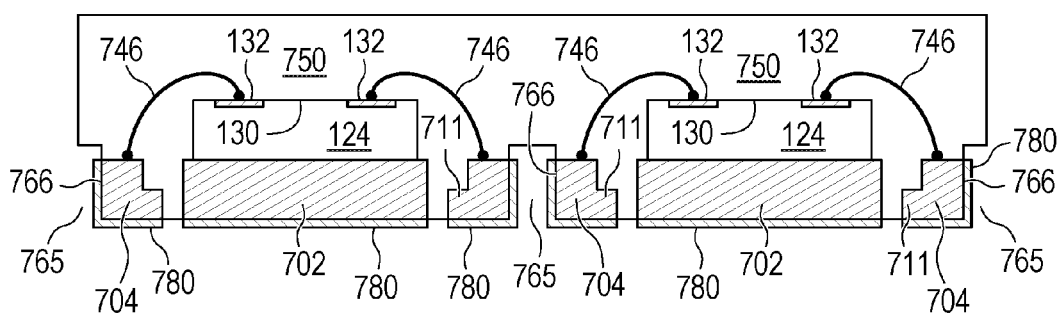

Each tie bar 711 extends in a substantially straight line across an entirety of leadframe 700. Bond wires are not used to connect adjacent units, such as with bond wires 548 in FIG. 5d. Rather, FIG. 7c shows trenches 765 formed by laser ablation or another process capable of selectively cutting through frame 708. Trenches 765 partially remove frame 708 between units to expose flanks 766 of contacts 704. Remaining portions of frame 708 remain electrically coupling tie bars 710 of adjacent units, so no additional wire bonds are required. In FIG. 7d, conductive layer 780 is plated onto die pads 702 and contacts 704, including flanks 766 for the full height of leadframe 700. Conductive layer 780 creates a wettable surface on flanks 766 that extends for the full height of leadframe 700, resulting in a visually verifiable fillet when the final packages are mounted onto a substrate.

Figure 7E:
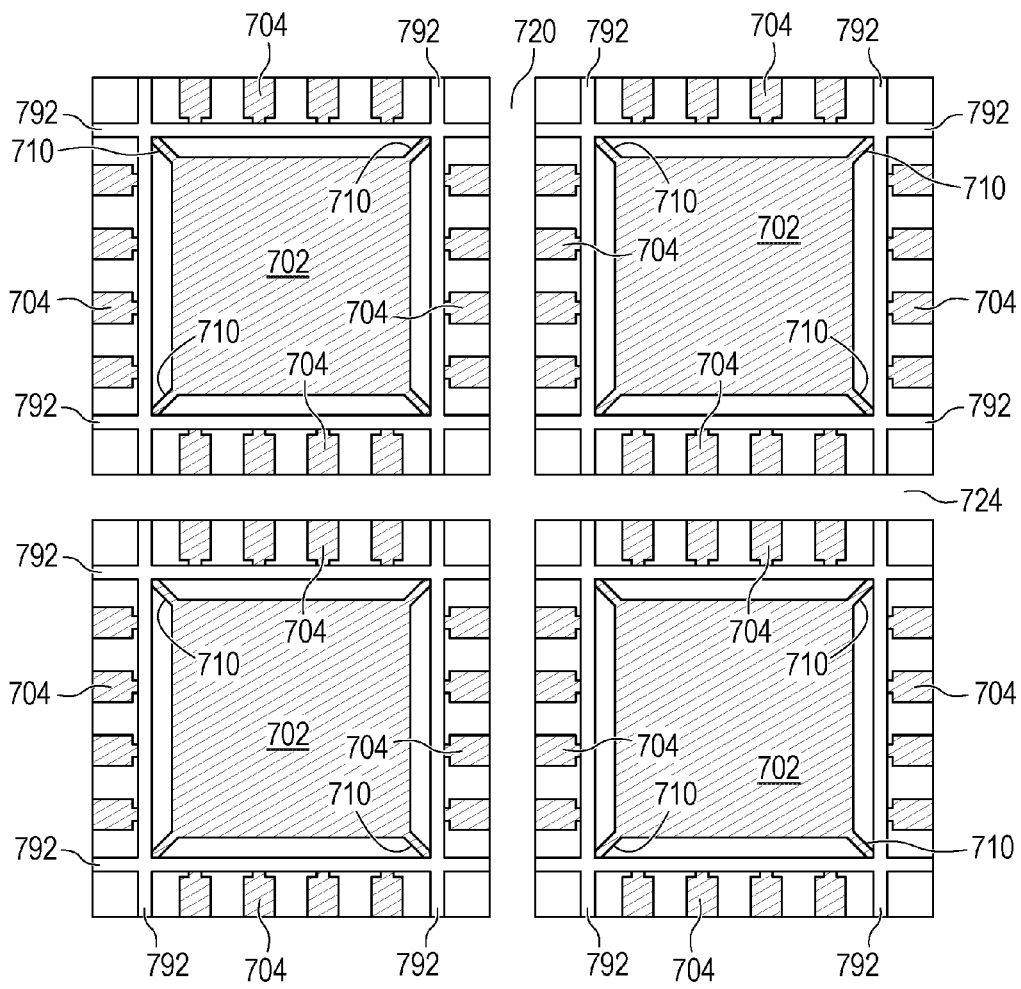
Figure 7F:
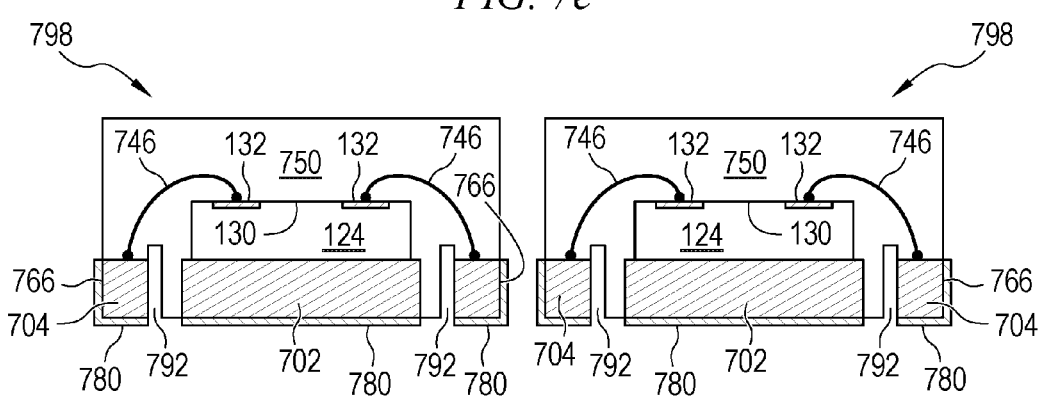

FIGS. 7e-7f illustrate trenches 792 formed to remove tie bars 710 and electrically isolate contacts 704 from each other. The panel with leadframe 700 is singulated through saw streets 720 and 724 to create individual leadless packages 798. Leadless packages 798 are QFN packages with plated conductive layer 780 formed on flanks 766 for the full thickness of leadframe 700. Electroplating for the full thickness of leadframe 700 creates a larger solder fillet than other plating methods that only plate for a portion of the leadframe thickness. The larger solder fillet is easier to visually verify.

While one or more embodiments have been illustrated and described in detail, the skilled artisan will appreciate that modifications and adaptations to those embodiments may be made without departing from the scope of the present disclosure.

What is claimed:
1. A method of making a semiconductor device, comprising:
   providing a leadframe including,
      a frame,
      a die pad,
      a contact including a flank of the contact adjacent to the frame,
      a first tie bar extending between the frame and die pad, and
      a second tie bar extending between the die pad and contact;
   disposing a semiconductor die over the die pad;
   depositing an encapsulant over the leadframe and semiconductor die;
   forming a first trench in the encapsulant to remove a portion of the frame and expose the flank of the contact;
   forming a conductive layer over the flank of the contact; and
   forming a second trench in the encapsulant through the second tie bar after forming the conductive layer.

2. The method of claim 1, further including:
   half-etching the frame, first tie bar, and second tie bar; and
   disposing the leadframe on a carrier with the contact and die pad contacting the carrier.

3. The method of claim 2, further including depositing the encapsulant between the carrier and the frame, first tie bar, and second tie bar.

4. The method of claim 2, further including half-etching a portion of the contact.

5. The method of claim 1, further including forming the conductive layer by electroplating.

6. The method of claim 1, further including forming a bond wire extending between a first portion of the frame and a second portion of the frame, wherein the first trench extends under the bond wire.

7. A method of making a semiconductor device, comprising:
   providing a leadframe including,
      a frame, a contact including a flank of the contact adjacent to the frame, and a tie bar electrically coupled between the contact and frame;

depositing an encapsulant over the leadframe;

forming a first trench in the encapsulant to remove a portion of the frame and expose the flank of the contact, wherein the first trench extends for an entire length of the frame;

forming a conductive layer over the flank of the contact; and forming a second trench in the encapsulant through the tie bar after forming the conductive layer.

8. The method of claim 7, further including:

half-etching the tie bar; and disposing the leadframe over a carrier with the contact on the carrier and the tie bar separated from the carrier.

9. The method of claim 8, further including depositing the encapsulant between the carrier and tie bar.

10. The method of claim 7, further including half-etching a portion of the contact.

11. The method of claim 7, further including forming the conductive layer by electroplating.

12. The method of claim 7, further including:

half-etching the tie bar from a top surface of the leadframe; and forming the second trench to remove the tie bar while leaving a portion of the leadframe over the second trench.

13. The method of claim 7, wherein forming the first trench completely removes the frame.

* * * * *